(12) United States Patent
Liaw

(10) Patent No.: US 8,879,305 B2
(45) Date of Patent: *Nov. 4, 2014

(54) MEMORY CELL

(71) Applicant: Taiwan Semiconductor Manufacturing Company, Ltd., Hsin-Chu (TW)

(72) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/104,835

(22) Filed: Dec. 12, 2013

(65) Prior Publication Data

US 2014/0133218 A1    May 15, 2014

Related U.S. Application Data

(63) Continuation of application No. 13/328,685, filed on Dec. 16, 2011, now Pat. No. 8,625,334.

(51) Int. Cl.
  *G11C 11/00* (2006.01)
  *G11C 11/412* (2006.01)
  *H01L 27/11* (2006.01)

(52) U.S. Cl.
  CPC .......... *G11C 11/412* (2013.01); *H01L 27/1104* (2013.01)
  USPC ................. 365/154; 365/189.09; 365/189.19; 365/230.05

(58) Field of Classification Search
  CPC .................... G11C 11/412; H01L 27/1104
  USPC ................ 365/154, 189.09, 189.19, 230.05
  See application file for complete search history.

(56) References Cited

U.S. PATENT DOCUMENTS 6,091,626 A    7/2000  Madan
7,271,451 B2    9/2007  Liaw
(Continued)

FOREIGN PATENT DOCUMENTS

JP    2002-222874 A    8/2002
JP    2011-515826 A    5/2011
(Continued)

OTHER PUBLICATIONS

Korean Office Action and English Translation, May 23, 2013, 9 pages.

*Primary Examiner* — Pho M Luu
(74) *Attorney, Agent, or Firm* — Slater & Matsil, L.L.P.

(57) ABSTRACT

A memory cell and array and a method of forming a memory cell and array are described. A memory cell includes first and second pull-up transistors, first and second pull-down transistors, first and second pass-gate transistors, and first and second isolation transistors. Drains of the first pull-up and first pull-down transistors are electrically coupled together at a first node. Drains of the second pull-up and second pull-down transistors are electrically coupled together at a second node. Gates of the second pull-up and second pull-down transistors are electrically coupled to the first node, and gates of the first pull-up and first pull-down transistors are electrically coupled to the second node. The first and second pass-gate transistors are electrically coupled to the first and second nodes, respectively. The first and second isolation transistors are electrically coupled to the first and second nodes, respectively.

20 Claims, 27 Drawing Sheets

(56) References Cited

U.S. PATENT DOCUMENTS

| | | |
|---|---|---|
| 7,420,854 B2 * | 9/2008 | Lee ........................ 365/189.05 |
| 7,471,544 B2 | 12/2008 | Nakazato |
| 7,660,149 B2 * | 2/2010 | Liaw ............................. 365/154 |
| 7,679,947 B2 * | 3/2010 | Liaw ............................. 365/154 |
| 7,773,407 B2 * | 8/2010 | Huang et al. ................. 365/154 |
| 7,808,812 B2 * | 10/2010 | Liu et al. ...................... 365/156 |
| 7,869,261 B2 | 1/2011 | Ozawa |
| 8,050,082 B2 | 11/2011 | Lee |
| 8,174,868 B2 | 5/2012 | Liaw |
| 8,625,334 B2 * | 1/2014 | Liaw ............................. 365/154 |
| 2002/0100920 A1 | 8/2002 | Yamauchi et al. |
| 2010/0259971 A1 | 10/2010 | Liaw |
| 2011/0195564 A1 | 8/2011 | Liaw et al. |

FOREIGN PATENT DOCUMENTS

| | | |
|---|---|---|
| JP | 2011-166142 A | 8/2011 |
| WO | 2009-059906 A1 | 5/2009 |

\* cited by examiner

MEMORY CELL

This application is a continuation of U.S. patent application Ser. No. 13/328,685, filed on Dec. 16, 2011, entitled "Memory Cell," now U.S. Pat. No. 8,625,334, which application is hereby incorporated herein by reference in its entirety.

BACKGROUND

Static random access memory (SRAM) is commonly used in integrated circuits. SRAM cells have the advantageous feature of holding data without a need for refreshing. SRAM cells may include different numbers of transistors, and are often referred to by the number of transistors, for example, six-transistor (6T) SRAM, eight-transistor (8T) SRAM, and the like. The transistors typically form a data latch for storing a bit. Additional transistors may be added to control access to the transistors. SRAM cells are typically arranged as an array having rows and columns. Each row of the SRAM cells is connected to a word line, which determines whether the current SRAM cell is selected or not. Each column of the SRAM cells is connected to a bit line (or a pair of complementary bit lines), which is used for writing a bit into, or reading a bit from, the SRAM cell.

Recent advances in finFET transistor technology have made advanced SRAM cells using finFET transistors possible. In contrast to the prior planar MOS transistor, which has a channel formed at the surface of a semiconductor substrate, a finFET has a three dimensional channel region. In the finFET, the channel for the transistor is formed on the sides, and sometimes also the top, of a "fin" of semiconductor material. The gate, typically a polysilicon or metal gate, extends over the fin and a gate dielectric is disposed between the gate and the fin. The three-dimensional shape of the finFET channel region allows for an increased gate width without increased silicon area even as the overall scale of the devices is reduced with semiconductor process scaling, and in conjunction with a reduced gate length, providing a reasonable channel width characteristic at a low silicon area cost.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a memory cell, such as a static random access memory (SRAM) cell. Other embodiments may also be applied, however, to other circuits and layouts of circuits where a greater uniformity of the layout is desired. Throughout the various views and illustrative embodiments, like reference numbers are used to designate like elements.

Figure 1:
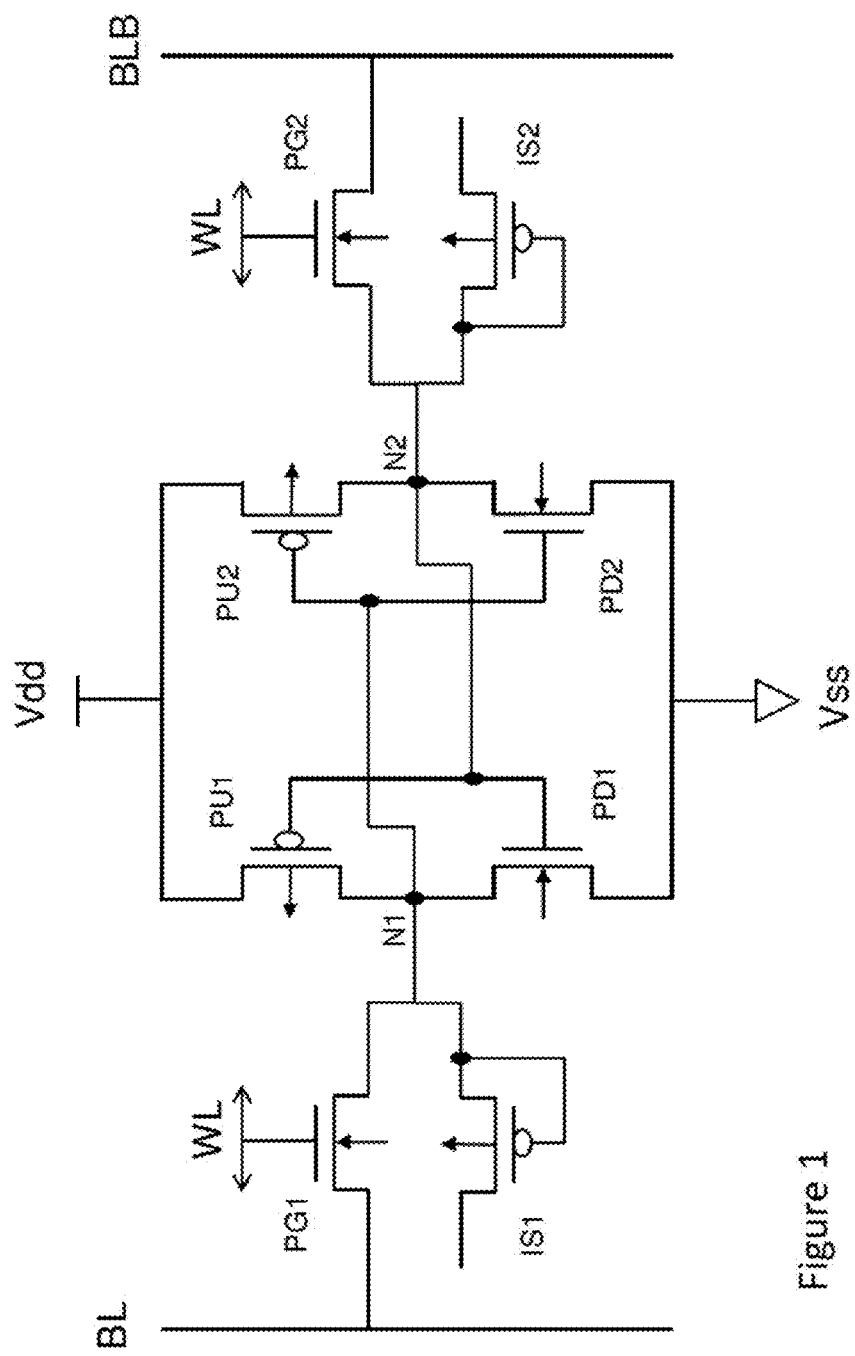
FIG. 1 is a circuit diagram of a single port static random access memory (SRAM) bit cell according to an embodiment.

FIG. 1 illustrates a circuit diagram of a single port SRAM bit cell according to an embodiment. The cell includes pull-up transistors PU1 and PU2, pull-down transistors PD1 and PD2, pass-gate transistors PG1 and PG2, and isolation transistors IS1 and IS2. As show in the circuit diagram, transistors PU1, PU2, IS1, and IS2 are p-type transistors, such as planar p-type field effect transistors (PFETs) or p-type fin field effect transistors (finFETs), and transistors PD1, PD2, PG1, and PG2 are n-type transistors, such as planar n-type field effect transistors (NFETs) or n-type finFETs.

The drains of pull-up transistors PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a data latch. The gates of transistors PU1 and PD1 are coupled together and to the drains of transistors PU2 and PD2, and the gates of transistors PU2 and PD2 are coupled together and to the drains of transistors PU1 and PD1. Sources of the pull-up transistors PU1 and PU2 are coupled to power voltage Vdd, and the sources of the pull-down transistors PD1 and PD2 are coupled to a ground voltage Vss.

Storage node N1 of the data latch is coupled to bit line BL through pass-gate transistor PG1, and storage node N2 is coupled to complementary bit line BLB through pass-gate transistor PG2. Storage nodes N1 and N2 are complementary nodes that are often at opposite logic levels (logic high or logic low). Gates of pass-gate transistors PG1 and PG2 are coupled to a word line WL. The source and gate of the isolation transistor IS1 are coupled together and to the storage node N1, and the source and gate of the isolation transistor IS2 are coupled together and to the storage node N2. Drains of the isolation transistors IS1 and IS2 are depicted as floating, but may be coupled to respective isolation transistors in adjacent cells, as will be discussed.

Figure 2:
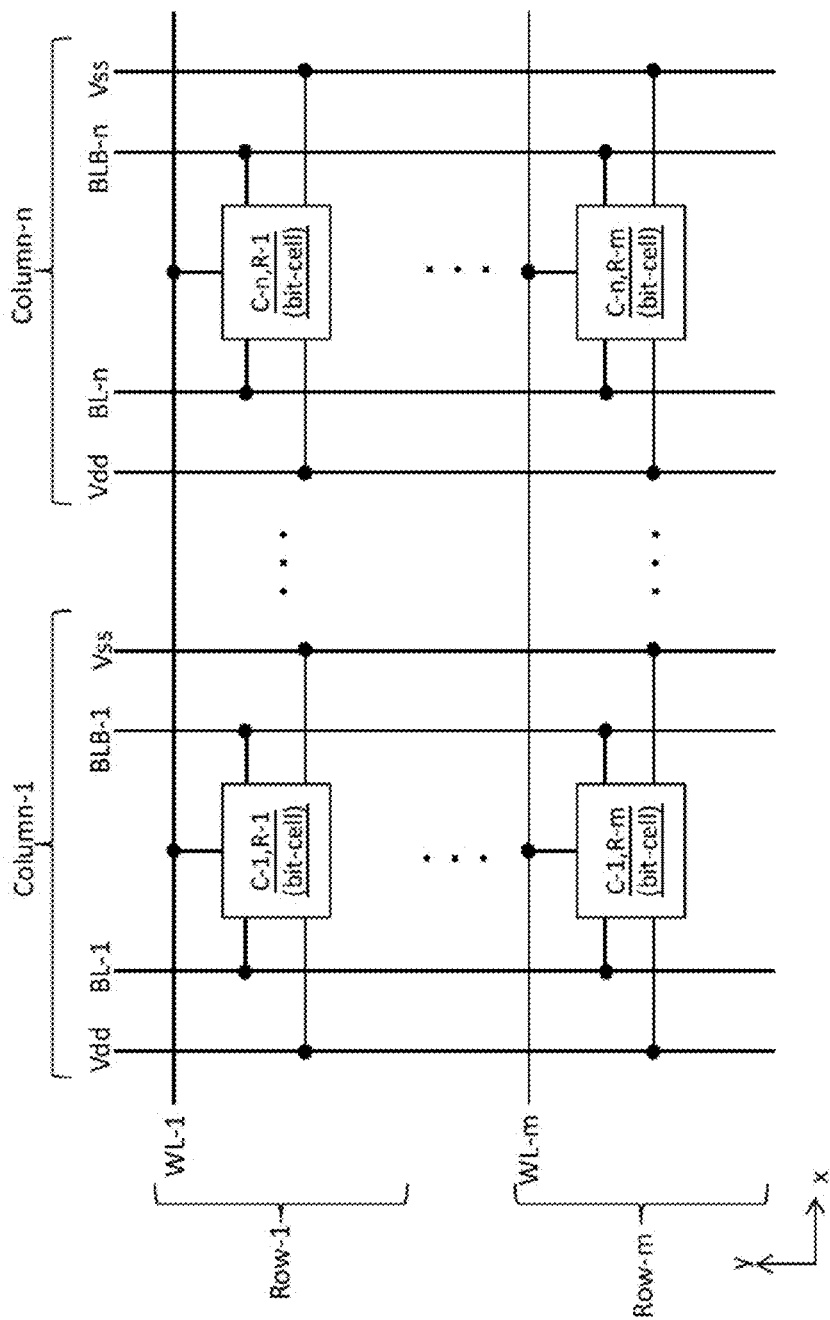
FIG. 2 is an array of bit cells, one example of a bit cell being depicted in FIG. 1, according to an embodiment.

FIG. 2 is an array of bit cells, one example of a bit cell being depicted in FIG. 1. The array has n number of columns and m number of rows. The array comprises mxn number of bit cells, with m number of bit cells in each column and n number of bit cells in each row. Each column has a bit line BL-n and a complementary bit line BLB-n, and each row has a word line WL-m. As a person having ordinary skill in the art will readily understand, a selection of a word line and a bit line will read from or write to a bit cell at the intersection of the selected word line and bit line. A power line Vdd and a ground line Vss are depicted in each column, but these lines may be in each row or in a combination of a row and a column, as will be discussed later.

Figure 3:
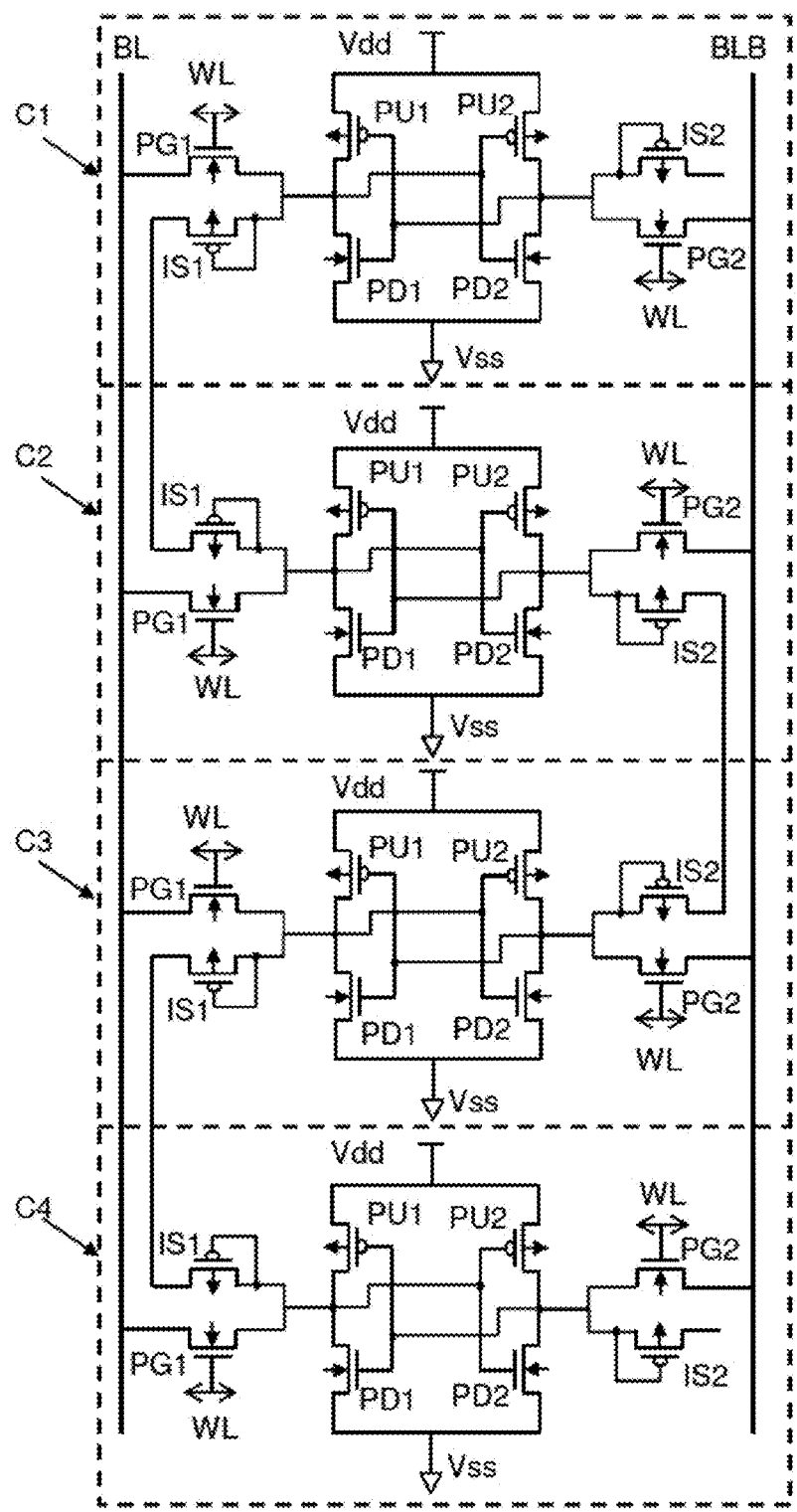
FIG. 3 is an example of a four bit cell column comprising bit cells in FIG. 1 according to an embodiment.

FIG. 3 is an example of a four bit cell column according to an embodiment. The column, as depicted, comprises four bit cells C1, C2, C3, and C4, each of which being the bit cell in FIG. 1 with boundaries indicated by the dashed lines. The bit line BL and complementary bit line BLB extend through each bit cell C1, C2, C3, and C4, as indicated in FIG. 2. The drain of the isolation transistor IS1 in each cell is coupled to the drain of another isolation transistor IS1 in an adjacent cell. For example, the drain of transistor IS1 in bit cell C1 is coupled to the drain of transistor IS1 in bit cell C2, and the drain of transistor IS1 in bit cell C3 is coupled to the drain of transistor IS1 in bit cell C4. Further, the drain of the isolation transistor IS2 in each cell is coupled to the drain of another isolation transistor IS2 in an adjacent cell. For example, the drain of transistor IS2 in bit cell C2 is coupled to the drain of transistor IS2 in bit cell C3. A person having ordinary skill in the art will readily understand that the drains of the isolation transistors IS2 in bit cells C1 and C4 can be coupled to isolation transistors in further adjacent cells, although four cells are depicted for illustration purposes. Isolation transistors IS1 or IS2 in cells at a beginning or end of a column can be coupled to transistors in dummy cells and/or left in a floating state.

Figure 4A:
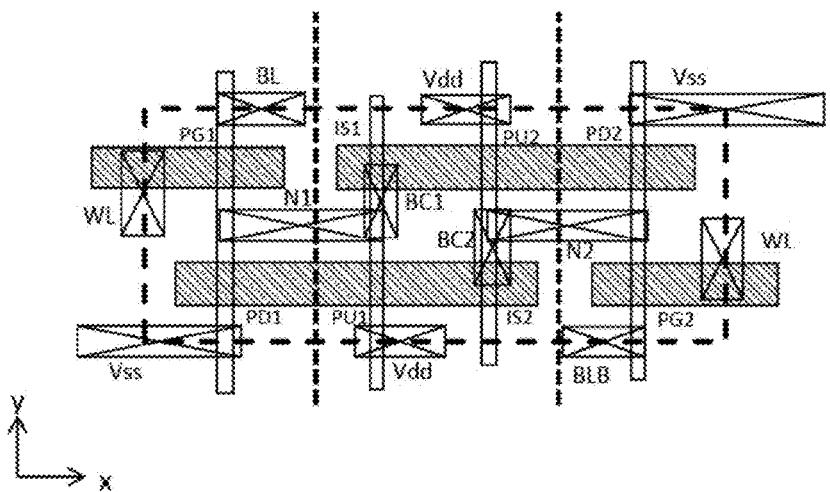
FIGS. 4A and 4B are example bit cell layouts for the bit cell in FIG. 1 according to embodiments.
Figure 4B:
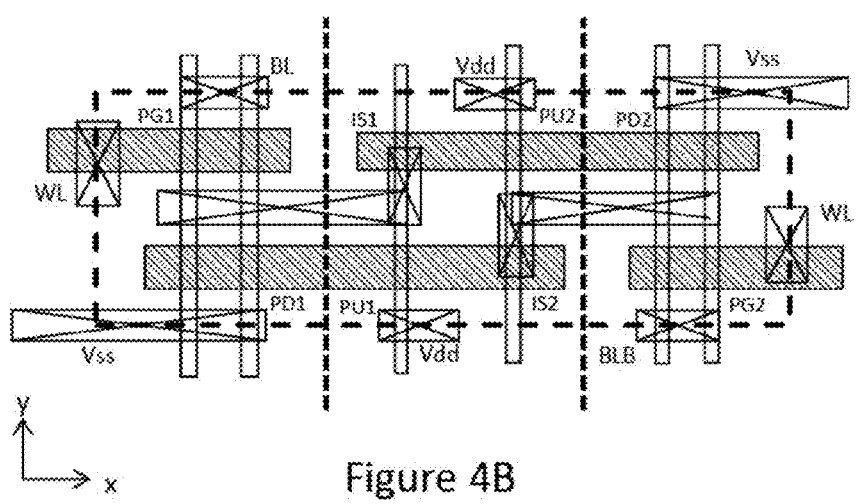

FIGS. 4A and 4B illustrate example bit cell layouts for the bit cell in FIG. 1 according to embodiments. In FIG. 4A, four active areas that make up the source/drain regions and channel regions of the various transistors extend longitudinally parallel across the width of the bit cell. For reference, longitudinal axes of the active areas extend in the y-direction of the bit cell. Four gate patterns of the various transistors extend longitudinally parallel along the length, e.g., the x-direction, of the bit cell. It should be noted that the terms width and length and the various directions are used for ease of reference and do not imply that a cell requires any particular dimensions or orientation. For further ease of reference, the dashed rectangle (as opposed to the two dashed lines intersecting the dashed rectangle) circumscribing the bit cell indicates a boundary of the bit cell.

The dashed lines that intersect the cell indicate boundaries between a p-type well in the substrate and an n-type well in the substrate in which respective active areas are formed. The active area of transistors PG1 and PD1 is formed in a p-type well, as these transistors are n-type transistors. The two active areas of transistors IS1, PU1, PU2, and IS2 are formed in an n-type well, as these transistors are p-type transistors. The active area of transistors PD2 and PG2 is formed in a p-type well, as these transistors are n-type transistors. As person having ordinary skill in the art will readily understand that source/drain regions of the active areas of the transistors are generally doped an opposite dopant type from that of the well. For example, a source/drain region is generally p-type doped when the well in which the active area is formed is an n-type well.

A single gate pattern is used as the gates of transistors PD1, PU1, and IS2, and another single gate pattern is used as the gates of transistors PD2, PU2, and IS1. In this manner, each single gate pattern electrically couples the gates of the respective three transistors. A gate pattern for pass-gate transistor PG1 extends beyond a cell boundary so that the gate pattern can be shared by an adjacent bit cell, as does a gate pattern for pass-gate transistor PG2.

Various contacts couple components in the bit cell. A word line contact WL is coupled to the gate of pass-gate transistor PG1, and another word line contact WL is coupled to the gate of pass-gate transistor PG2. A bit line contact BL is coupled to the drain of pass-gate transistor PG1, and an complementary bit line contact BLB is coupled to the drain of pass-gate transistor PG2. A power contact Vdd is coupled to the source of pull-up transistor PU1, and another power contact Vdd is coupled to the source of pull-up transistor PU2. A ground contact Vss is coupled to the source of pull-down transistor PD1, and another ground contact Vss is coupled to the source of pull-down transistor PD2. A node contact N1 couples together the sources of transistors PG1 and IS1 and the drains of transistors PD1 and PU1, and a node contact N2 couples together the sources of transistors PG2 and IS2 and the drains of transistors PD2 and PU2. A butted contact BC1 couples the source of isolation transistor IS1 to the gate of the isolation transistor IS1, and a butted contact BC2 couples the source of isolation transistor IS2 to the gate of the isolation transistor IS2.

FIG. 4B is a second example of a bit cell layout. The cell layout of FIG. 4B is similar to FIG. 4A, and includes transistors in the p-type wells with a double pitch. In this example, a double pitch refers generally to a transistor comprising two active areas. In FIG. 4B, two active areas extend across the width of the cell in a p-type well to form components of transistors PG1 and PD1, and similarly, two active areas extend across the width of the cell in a p-type well to form components of transistors PG2 and PD2. Various modifications can be made to contacts and gates to extend to cover and/or contact appropriate components. By having a double pitch to transistors PG1, PD1, PD2, and PG2, the channel width of each transistor can be effectively doubled thus increasing the driving ability of each transistor. Other embodiments contemplate various different pitches for various transistors.

Figure 5:
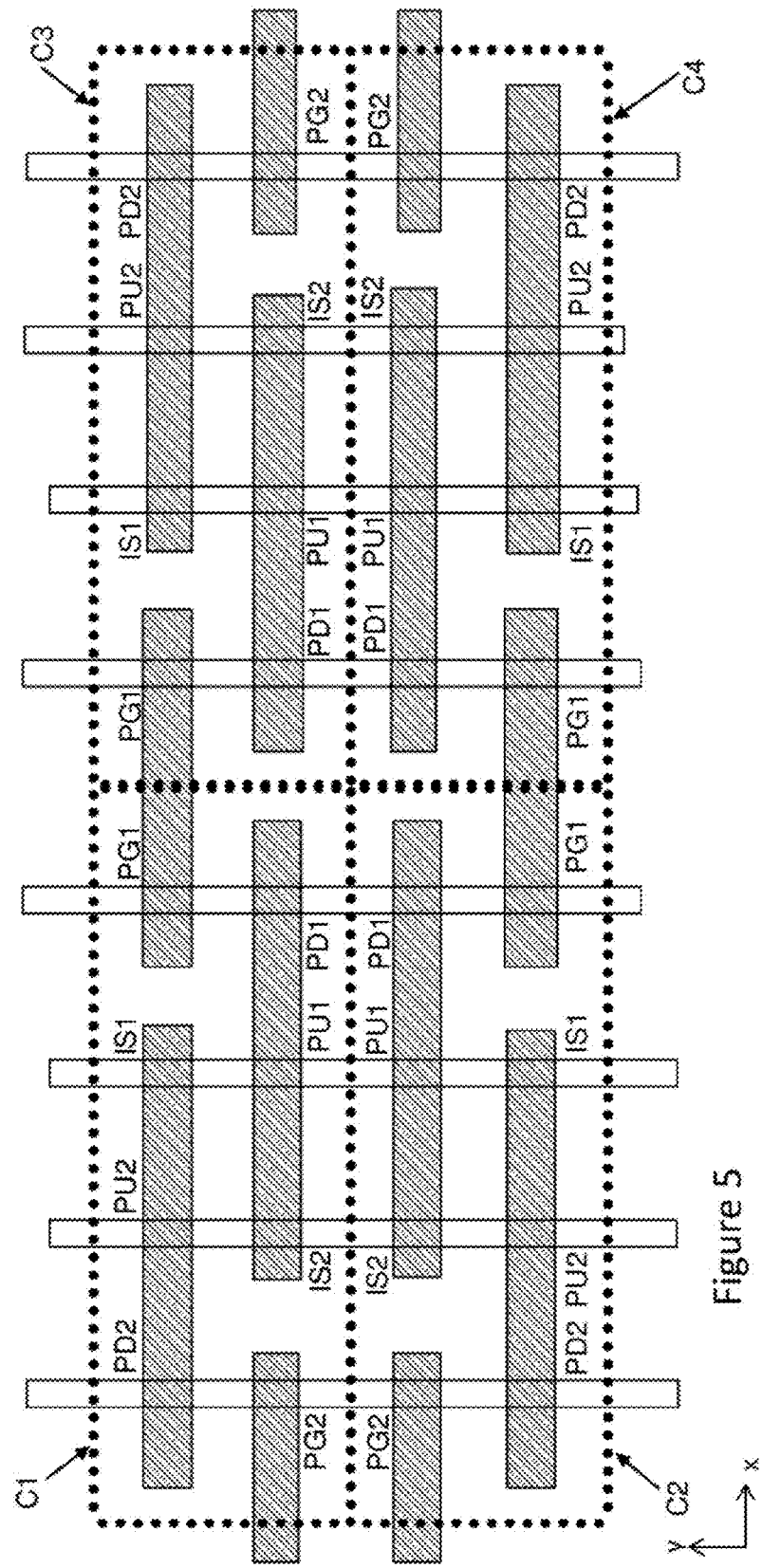
FIG. 5 is an example 2×2 array of bit cells with each bit cell using the bit cell layout of FIG. 4A according to an embodiment.

FIG. 5 depicts an example 2×2 array of bit cells C1, C2, C3, and C4 with each bit cell using the bit cell layout of FIG. 4A according to an embodiment. It should be noted that the bit cell layout of FIG. 4B or other layouts may be similarly used. For ease of reference, a column is referred to as being in the y-direction in this example. Thus, bit cells C1 and C2 are in a first column, and bit cells C3 and C4 are in a second column. As depicted, adjacent cells in the array are mirror images along a border between the adjacent cells.

Each active area in a bit cell extends through multiple bit cells in a column. In an embodiment, each active area in a bit cell extends through all of the bit cells in a column. In other embodiments, each active area extends through less than all of the bit cells in the column. In FIG. 5, the active area for transistors IS2 and PU2 in bit cell C1 extends through bit cell C2 as the active area for transistors PU2 and IS2. In this configuration, the drains of the isolation transistors IS2 in adjacent bit cells C1 and C2 are coupled together (such as depicted in FIG. 3 between bit cells C2 and C3) because the drains share a common node along the same active area. Similarly, the active area for transistors IS2 and PU2 in bit cell C3 extends through bit cell C4 as the active area for transistors PU2 and IS2. Although not illustrated, each of the active areas of isolation transistors IS1 in each bit cell extends into an adjacent bit cell to be the active area of respective isolation transistors IS1 in the adjacent bit cell, thereby forming the coupling between isolation transistors IS1 in adjacent bit cells, as depicted in FIG. 3.

In operation, the bit cells in FIGS. 1 through 5 generally operate as a conventional single port SRAM cell operates. When write operations are performed, pass-gate transistors PG1 and PG2 are turned on, and a voltage to which the bit line BL and the complementary bit line BLB are driven will be sensed through the pass-gate transistors PG1 and PG2 by the cross-coupled transistors PU1, PU2, PD1, and PD2. The cross-coupled transistors PU1, PU2, PD1, and PD2 drive the storage nodes N1 and N2 to a high or low state based on the sensing (with the storage nodes N1 and N2 being complementary of each other). The data is thus written into the bit cell through bit lines BL and BLB. Conversely, when read operations are performed, pass-gate transistors PG1 and PG2 are turned on, and the data is read onto the bit line BL and complementary bit line BLB through the pass-gate transistors PG1 and PG2.

The isolation transistors IS1 and IS2 may have a negligible effect on the operation of the bit cell. When the node to which the source and gate of the isolation transistor IS1 or IS2 is coupled is at a high voltage, e.g., a logic high, the voltage at the gate of the isolation transistor IS1 or IS2 is also high, and the isolation transistor IS1 or IS2 will be in an "off" state. When the node is at a low voltage, e.g., a logic low, the voltage at the gate will also be low, and the isolation transistor IS1 or IS2 will be in an "on" state. However, because the voltage at the source is also low, such as coupled to ground, no current will flow away from the node through the isolation transistor IS1 or IS2. In some instances, a small amount of leakage may flow through the isolation transistor IS1 or IS2 when the voltage at the node is switched, e.g., from low to high and vice versa. With fast switching times and/or low voltages, the leakage current can be very small and negligible.

By having the bit cells in the configuration in FIG. 5, active areas can be uniformly spaced and can uniformly extend throughout an array of bit cells. For example, the spacing between active areas in the x-direction can be uniform, although in embodiments comprising double pitch or other multiple pitch transistors, the spacing may not be uniform, particularly because of the spacing between the active areas of the multiple pitch transistors. Further, the active areas can extend longitudinally across multiple bit cells without being interrupted by an isolation area. This configuration can improve the uniformity of an array layout, and thereby, avoid lithography problems that may arise in forming the active areas, particularly fins for finFET active areas and in small technology nodes.

FIG. 6A through 8B illustrate various examples of metallization patterns for the bit cell layouts in FIGS. 4A and 4B. The dashed rectangles in these figures indicate a boundary of the bit cell that corresponds to the boundary shown in FIGS. 4A and 4B. These are example patterns, and a person having ordinary skill in the art will readily appreciate various modifications to the examples or different patterns that are contemplated within the scope of embodiments.

Figure 6A:
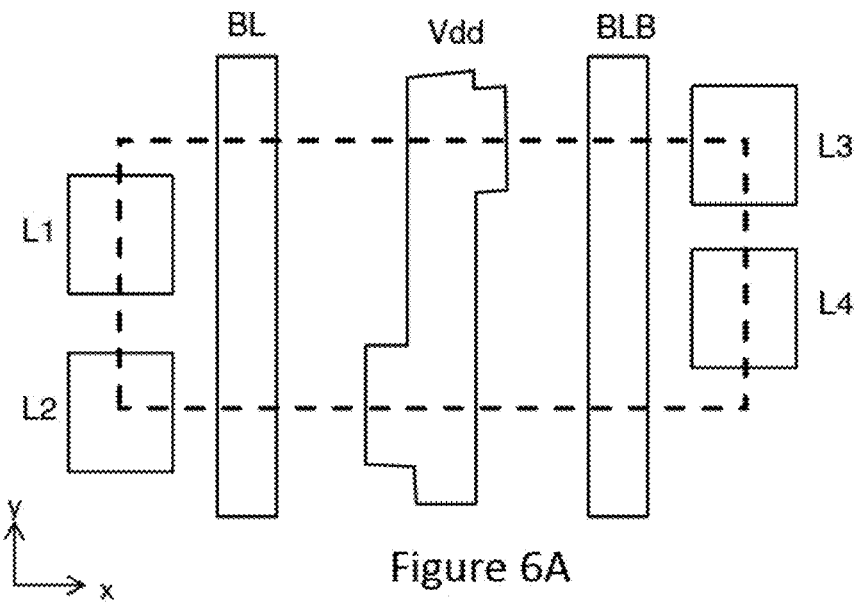
FIGS. 6A and 6B are a first example of metallization patterns for the bit cell layouts in FIG. 4A according to an embodiment.
Figure 6B:
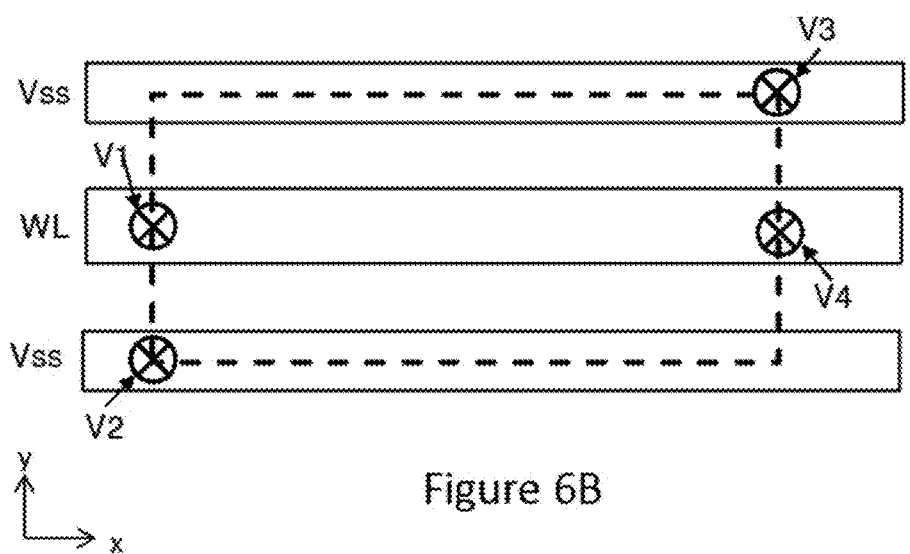

FIG. 6A is a first metallization pattern M1 in a first inter-metal dielectric layer IMD1, and FIG. 6B is a second metallization pattern M2 in a second inter-metal dielectric layer IMD2 overlying the first inter-metal dielectric layer IMD1. In FIG. 6A, the first metallization pattern M1 includes a bit line trace BL, a power trace Vdd, and a complementary bit line trace BLB, each extending substantially longitudinally in the y-direction, which in the context of FIG. 5 is along a column. The first metallization pattern M1 further includes four landing pads L1, L2, L3, and L4. Although not expressly shown, a person having ordinary skill in the art will readily understand that vias extend below and from the first metallization pattern M1 to the respective contacts shown in the bit cell layouts in FIGS. 4A and 4B. In FIG. 6B, the second metallization pattern M2 includes a word line trace WL and two ground traces Vss, each extending longitudinally in the x-direction, which in the context of FIG. 5 is along a row. Vias V1, V2, V3, and V4 extend below and from the second metallization pattern M2 to respective landing pads L1, L2, L3, and L4 in the first metallization pattern M1. Each of the traces in FIGS. 6A and 6B can transverse multiple cells in the respective directions in which the traces longitudinally extend.

Figure 7A:
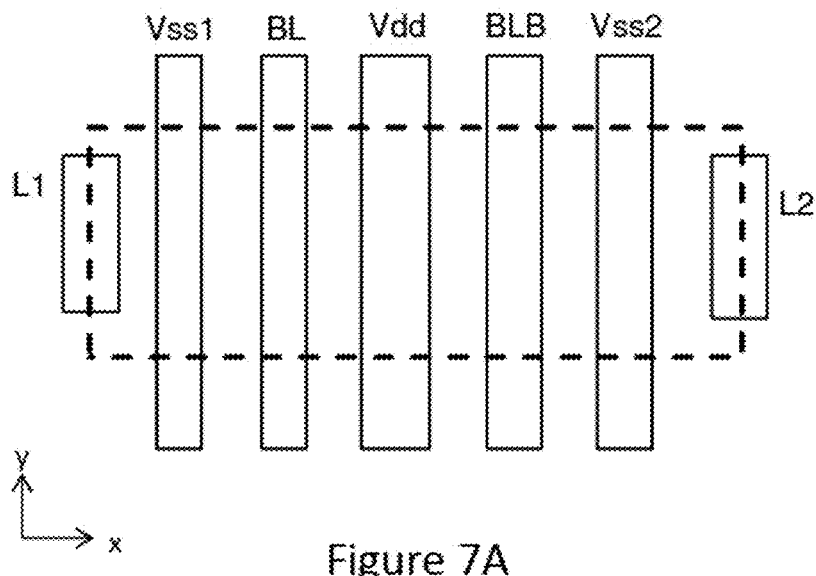
FIGS. 7A and 7B are a second example of metallization patterns for the bit cell layouts in FIG. 4A according to an embodiment.
Figure 7B:
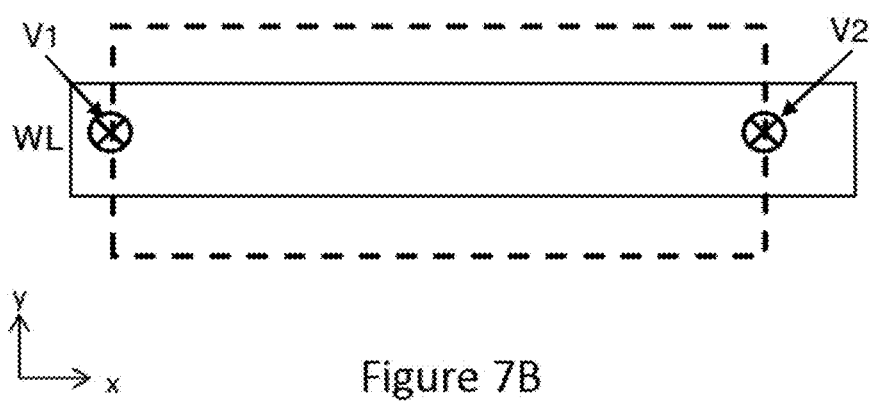

FIG. 7A is a first metallization pattern M1 in a first inter-metal dielectric layer IMD1, and FIG. 7B is a second metallization pattern M2 in a second inter-metal dielectric layer IMD2 overlying the first inter-metal dielectric layer IMD1. In FIG. 7A, the first metallization pattern M1 includes a first ground trace Vss1, a bit line trace BL, a power trace Vdd, a complementary bit line trace BLB, and a second ground trace Vss2, each extending longitudinally in the y-direction, which in the context of FIG. 5 is along a column. The first metallization pattern M1 further includes two landing pads L1 and L2. Although not expressly shown, a person having ordinary skill in the art will readily understand that vias extend below and from the first metallization pattern M1 to the respective contacts shown in the bit cell layouts in FIGS. 4A and 4B. In FIG. 7B, the second metallization pattern M2 includes a word line trace WL extending longitudinally in the x-direction, which in the context of FIG. 5 is along a row. Vias V1 and V2 extend below and from the second metallization pattern M2 to respective landing pads L1 and L2 in the first metallization pattern M1. Each of the traces in FIGS. 7A and 7B can transverse multiple cells in the respective directions in which the traces longitudinally extend.

Figure 8A:
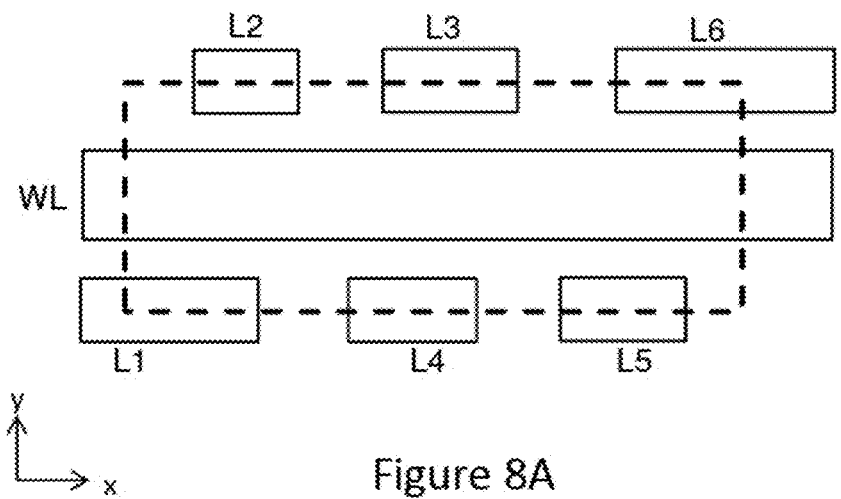
FIGS. 8A and 8B are a third example of metallization patterns for the bit cell layouts in FIG. 4A according to an embodiment.
Figure 8B:
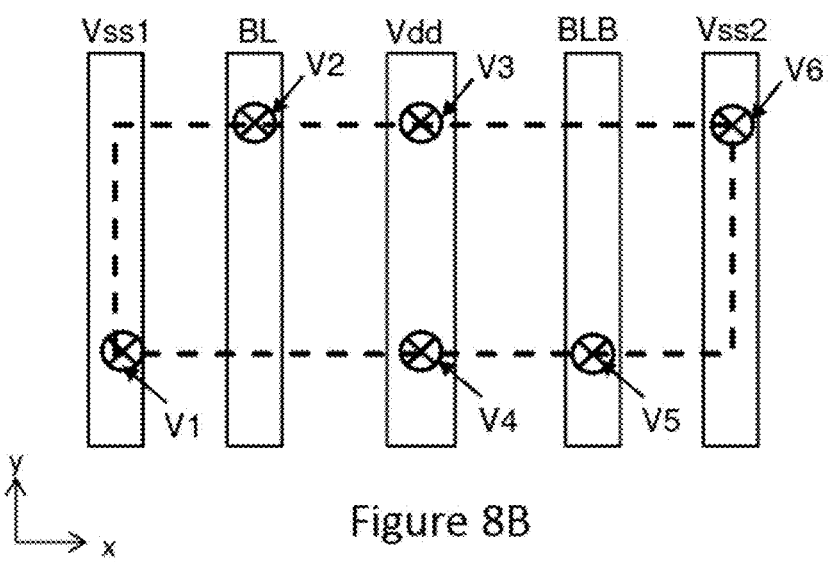

FIG. 8A is a first metallization pattern M1 in a first inter-metal dielectric layer IMD1, and FIG. 8B is a second metallization pattern M2 in a second inter-metal dielectric layer IMD2 overlying the first inter-metal dielectric layer IMD1. In FIG. 8A, the first metallization pattern M1 includes a word line trace WL extending longitudinally in the x-direction, which in the context of FIG. 5 is along a row. The first metallization pattern M1 further includes six landing pads L1, L2, L3, L4, L5, and L6. Although not expressly shown, a person having ordinary skill in the art will readily understand that vias extend below and from the first metallization pattern M1 to the respective contacts shown in the bit cell layouts in FIGS. 4A and 4B. In FIG. 8B, the second metallization pattern M2 includes a first ground trace Vss1, a bit line trace BL, a power trace Vdd, a complementary bit line trace BLB, and a second ground trace Vss2, each extending longitudinally in the y-direction, which in the context of FIG. 5 is along a column. Vias V1, V2, V3, V4, V5, and V6 extend below and from the second metallization pattern M2 to respective landing pads L1, L2, L3, L4, L5, and L6 in the first metallization pattern M1. Each of the traces in FIGS. 8A and 8B can transverse multiple cells in the respective directions in which the traces longitudinally extend.

Figure 9A:
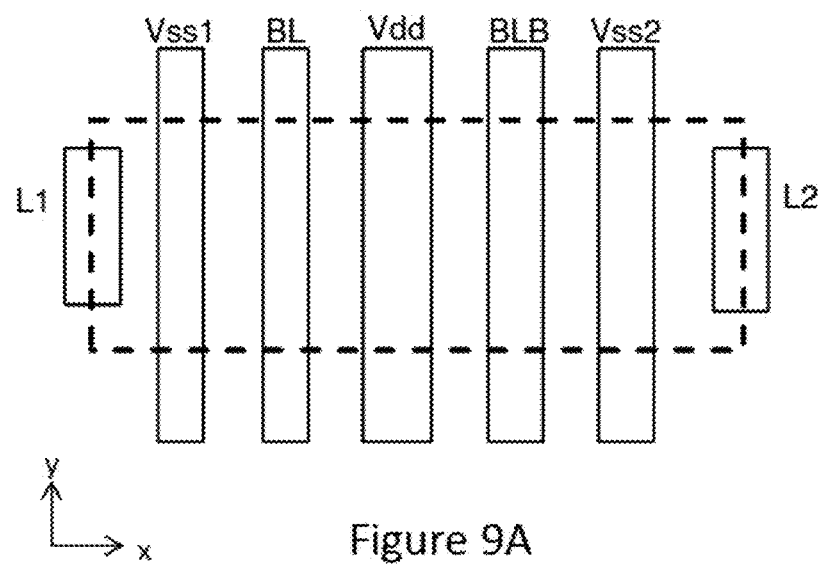
FIGS. 9A and 9B are a fourth example of metallization patterns for the bit cell layouts in FIG. 4A according to an embodiment.
Figure 9B:
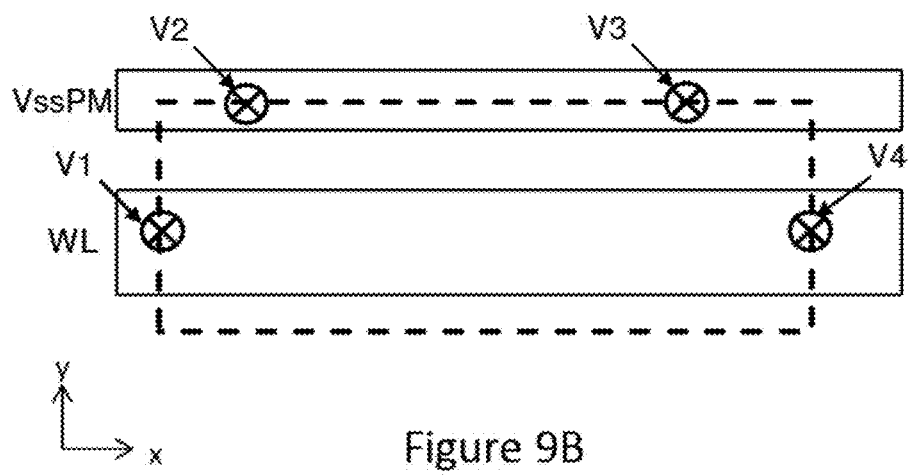

FIG. 9A is a first metallization pattern M1 in a first inter-metal dielectric layer IMD1, and FIG. 9B is a second metallization pattern M2 in a second inter-metal dielectric layer IMD2 overlying the first inter-metal dielectric layer IMD1. In FIG. 9A, the first metallization pattern M1 includes a first ground trace Vss1, a bit line trace BL, a power trace Vdd, a complementary bit line trace BLB, and a second ground trace Vss2, each extending longitudinally in the y-direction, which in the context of FIG. 5 is along a column. The first metallization pattern M1 further includes two landing pads L1 and L2. Although not expressly shown, a person having ordinary skill in the art will readily understand that vias extend below and from the first metallization pattern M1 to the respective contacts shown in the bit cell layouts in FIGS. 4A and 4B. In FIG. 9B, the second metallization pattern M2 includes a word line trace WL and a ground power mesh trace VssPM, each extending longitudinally in the x-direction, which in the context of FIG. 5 is along a row. Vias V1 and V4 extend below and from the second metallization pattern M2 to respective landing pads L1 and L2 in the first metallization pattern M1. Vias V2 and V3 extend below and from the second metallization pattern M2 to couple the first ground trace Vss1 and the second ground trace Vss2, respectively. The ground power mesh trace VssPM can be used to aid in preventing the first ground trace Vss1 and the second ground trace Vss2 from having a voltage difference between those traces. Each of the traces in FIGS. 9A and 9B can transverse multiple cells in the respective directions in which the traces longitudinally extend.

Figure 10:
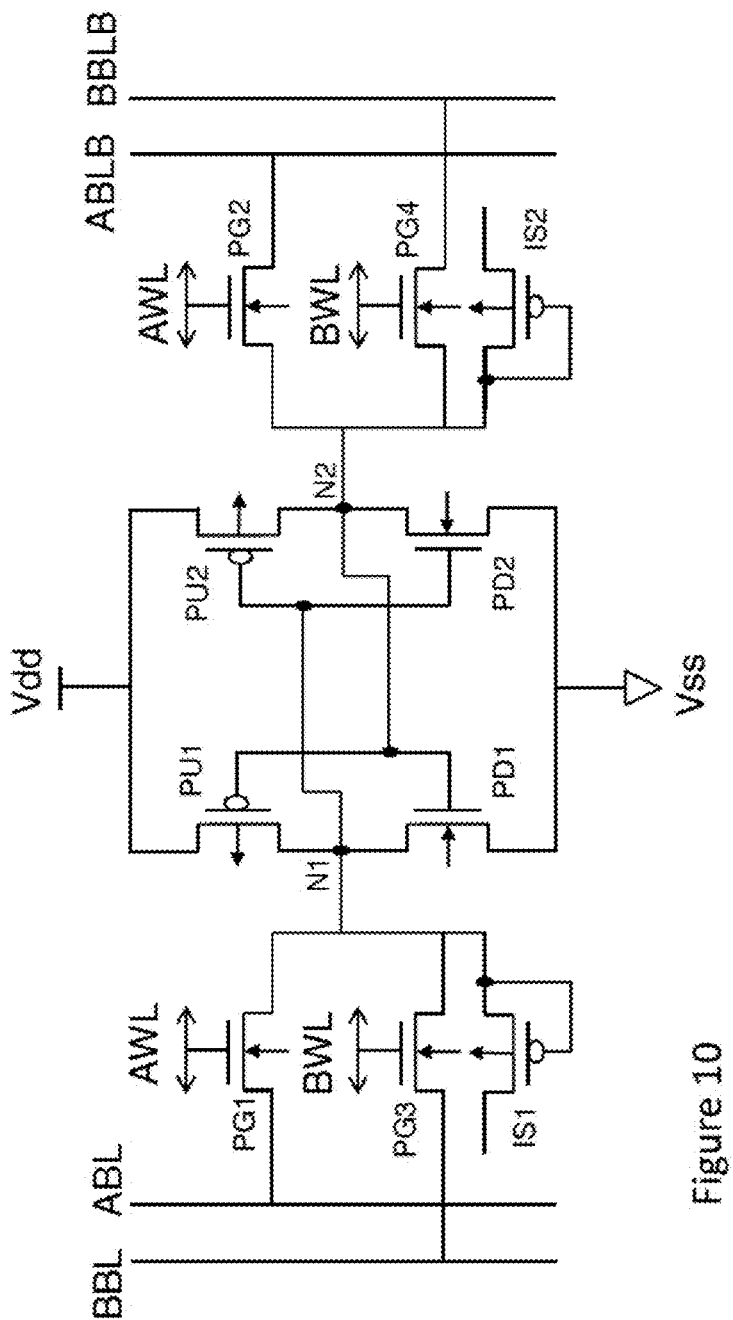
FIG. 10 is a circuit diagram of a dual port SRAM bit cell according to an embodiment.

FIG. 10 illustrates a circuit diagram of a dual port SRAM bit cell according to an embodiment. The cell includes pull-up transistors PU1 and PU2, pull-down transistors PD1 and PD2, pass-gate transistors PG1, PG2, PG3, and PG4, and isolation transistors IS1 and IS2. As show in the circuit diagram, transistors PU1, PU2, IS1, and IS2 are p-type transistors, such as planar PFETs or p-type finFETs, and transistors PD1, PD2, PG1, PG2, PG3, and PG4 are n-type transistors, such as planar NFETs or n-type finFETs.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a data latch. The gates of transistors PU1 and PD1 are coupled together and to the drains of transistors PU2 and PD2, and the gates of transistors PU2 and PD2 are coupled together and to the drains of transistors PU1 and PD1. Sources of the pull-up transistors PU1 and PU2 are coupled to power voltage Vdd, and the sources of the pull-down transistors PD1 and PD2 are coupled to a ground voltage Vss.

Storage node N1 of the data latch is coupled to a first bit line ABL through pass-gate transistor PG1 and to a second bit line BBL through pass-gate transistor PG3, and storage node N2 is coupled to a complementary first bit line ABLB through pass-gate transistor PG2 and to a complementary second bit line BBLB through pass-gate transistor PG4. Storage nodes N1 and N2 are complementary nodes that are often at opposite logic levels (logic high or logic low). Gates of pass-gate transistors PG1 and PG2 are coupled to a first word line AWL, and gates of pass-gate transistors PG3 and PG4 are coupled to a second word line BWL. The source and gate of the isolation transistor IS1 are coupled together and to the storage node N1, and the source and gate of the isolation transistor IS2 are coupled together and to the storage node N2. Drains of the isolation transistors IS1 and IS2 are depicted as floating, but may be coupled to respective isolation transistors in adjacent cells, as will be discussed.

Figure 11:
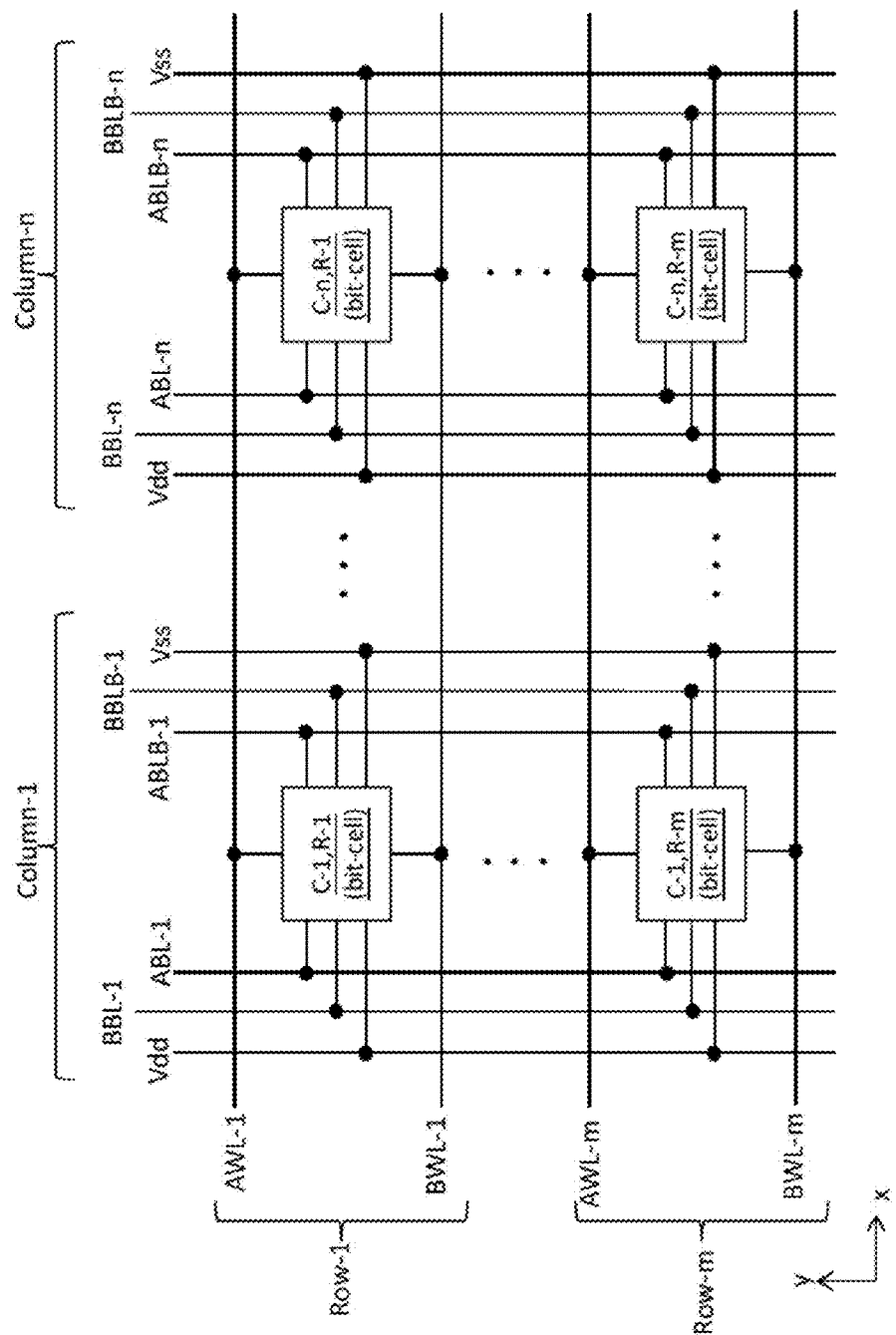
FIG. 11 is an array of bit cells, one example of a bit cell being depicted in FIG. 10, according to an embodiment.

FIG. 11 is an array of bit cells, one example of a bit cell being depicted in FIG. 10. The array has n number of columns and m number of rows. The array comprises m×n number of bit cells, with m number of bit cells in each column and n number of bit cells in each row. Each column has a first bit line ABL-n, a complementary first bit line ABLB-n, a second bit line BBL-n, and a complementary second bit line BBLB-n, and each row has a first word line AWL-m and a second word line BWL-m. As a person having ordinary skill in the art will readily understand, a selection of a word line and a bit line will read from or write to a bit cell at the intersection of the selected word line and bit line. A power line Vdd and a ground line Vss are depicted in each column, but these lines may be in each row or in a combination of a row and a column.

Figure 12:
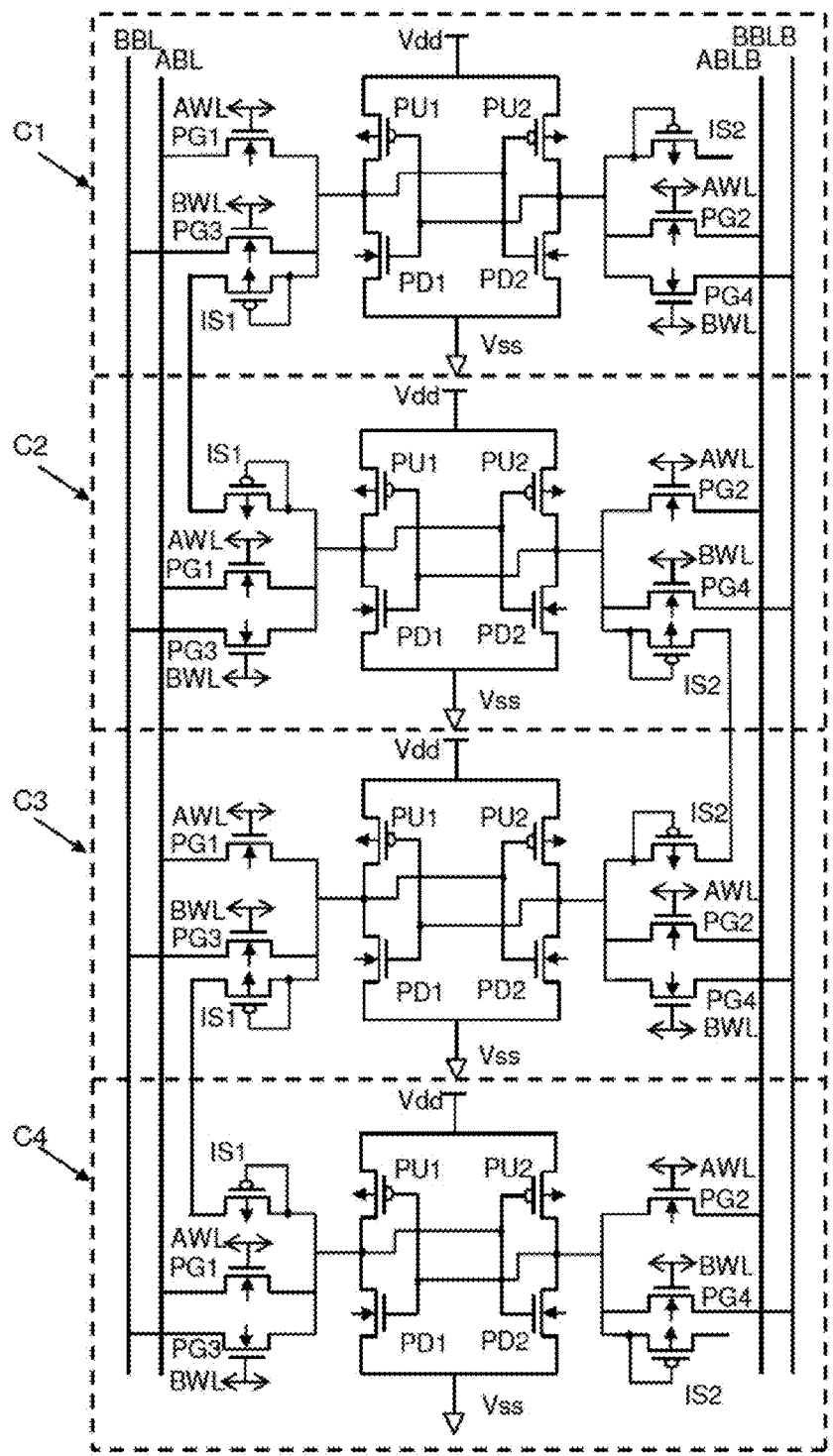
FIG. 12 is an example of a four bit cell column comprising bit cells in FIG. 10 according to an embodiment.

FIG. 12 is an example of a four bit cell column according to an embodiment. The column, as depicted, comprises four bit cells C1, C2, C3, and C4, each of which being the bit cell in FIG. 10 with boundaries indicated by the dashed lines. The first bit line ABL, complementary first bit line ABLB, the second bit line BBL, and complementary second bit line BBLB extend through each bit cell C1, C2, C3, and C4, as indicated in FIG. 11. The drain of the isolation transistor IS1 in each cell is coupled to the drain of another isolation transistor IS1 in an adjacent cell. For example, the drain of isolation transistor IS1 in bit cell C1 is coupled to the drain of isolation transistor IS1 in bit cell C2, and the drain of isolation transistor IS1 in bit cell C3 is coupled to the drain of isolation transistor IS1 in bit cell C4. Further, the drain of the isolation transistor IS2 in each cell is coupled to the drain of another isolation transistor IS2 in an adjacent cell. For example, the drain of isolation transistor IS2 in bit cell C2 is coupled to the drain of isolation transistor IS2 in bit cell C3. A person having ordinary skill in the art will readily understand that the drains of the isolation transistors IS2 in bit cells C1 and C4 can be coupled to isolation transistors in further adjacent cells, although four cells are depicted for illustration purposes. Isolation transistors IS1 or IS2 in cells at a beginning or end of a column can be coupled to transistors in dummy cells and/or left in a floating state.

Figure 13:
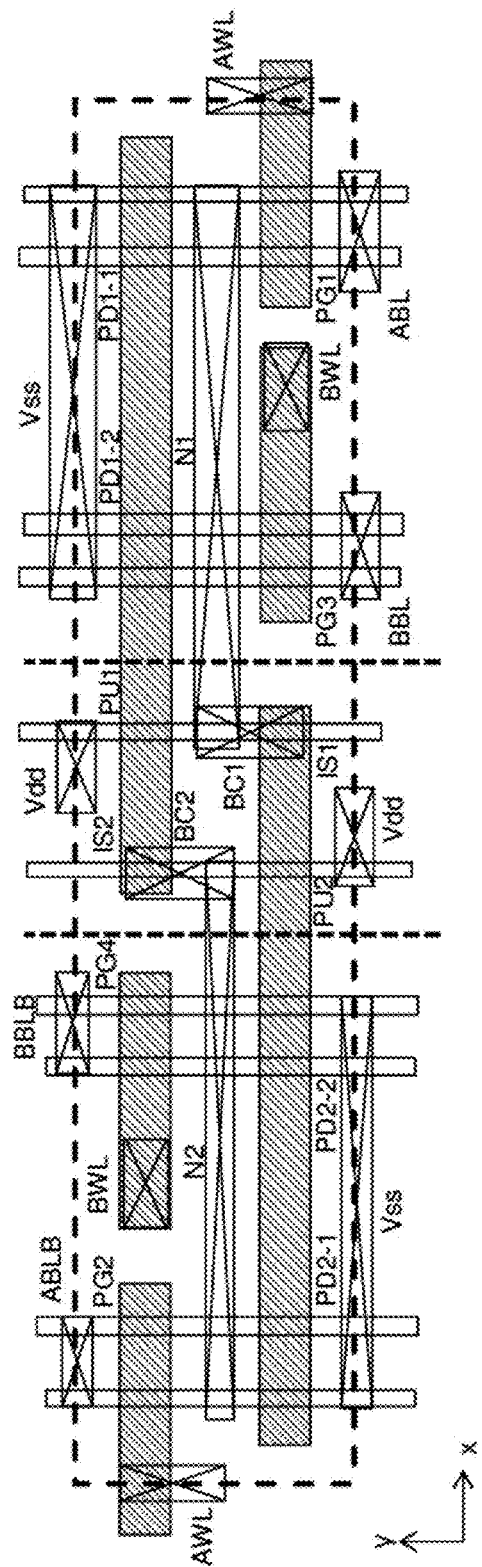
FIG. 13 is an example bit cell layout for the bit cell in FIG. 10 according to an embodiment.

FIG. 13 illustrates an example bit cell layout for the bit cell in FIG. 10 according to an embodiment. In FIG. 13, ten active areas that make up the source/drain regions and channel regions of the various transistors extend longitudinally parallel across the width of the bit cell. For reference, longitudinal axes of the active areas extend in the y-direction of the bit cell. Six gate patterns of the various transistors extend longitudinally parallel along the length, e.g., the x-direction, of the bit cell. It should be noted that the terms width and length and the various directions are used for ease of reference and do not imply that a cell requires any particular dimensions or orientation. For further ease of reference, the dashed rectangle (as opposed to the two dashed lines intersecting the dashed rectangle) circumscribing the bit cell indicates a boundary of the bit cell.

The dashed lines that intersect the cell indicate boundaries between a p-type well in the substrate and an n-type well in the substrate in which respective active areas are formed. The four active areas of transistors PG1, PG3, and PD1 are formed in a p-type well, as these transistors are n-type transistors. The two active areas of transistors IS1, PU1, PU2, and IS2 are formed in an n-type well, as these transistors are p-type transistors. The four active areas of transistors PG2, PG4, and PD2 are formed in a p-type well, as these transistors are n-type transistors.

As depicted the pull-down transistors PD1 and PD2 are each essentially a quadruple pitch transistor, with each transistor comprising two parallel coupled double pitch transistors PD1-1 and PD1-2 (for transistor PD1) and PD2-1 and PD2-1 (for transistor PD2). Further the pass-gate transistors PG1, PG2, PG3, and PG4 are each double pitch transistors. FIG. 13 is an example layout, and various transistors can be single or multiple pitch transistors.

A single gate pattern is used as the gates of transistors PD1, PU1, and IS2, and another single gate pattern is used as the gates of transistors PD2, PU2, and IS1. In this manner, each single gate pattern electrically couples the gates of the respective three transistors. A gate pattern for pass-gate transistor PG1 extends beyond a cell boundary so that the gate pattern can be shared by an adjacent bit cell, as does a gate pattern for pass-gate transistor PG2. Each of pass-gate transistors PG3 and PG4 has a gate pattern that does not extend to another transistor and remains internal to the bit cell.

Various contacts couple components in the bit cell. A first word line contact AWL is coupled to the gate of pass-gate transistor PG1, and another first word line contact AWL is coupled to the gate of pass-gate transistor PG2. A second word line contact BWL is coupled to the gate of pass-gate transistor PG3, and another second word line contact BWL is coupled to the gate of pass-gate transistor PG4. A first bit line contact ABL is coupled to the drain of pass-gate transistor PG1, and a complementary first bit line contact ABLB is coupled to the drain of pass-gate transistor PG2. A second bit line contact BBL is coupled to the drain of pass-gate transistor PG3, and a complementary second bit line contact BBLB is coupled to the drain of pass-gate transistor PG4. A power contact Vdd is coupled to the source of pull-up transistor PU1, and another power contact Vdd is coupled to the source of pull-up transistor PU2. A ground contact Vss is coupled to the source of pull-down transistor PD1 (or the sources of transistors PD1-2 and PD1-1 with the quadruple pitch transistor, as depicted), and another ground contact Vss is coupled to the source of pull-down transistor PD2 (or the sources of transistors PD2-2 and PD2-1 with the quadruple pitch transistor, as depicted). A node contact N1 couples together the sources of transistors PG1, PG3, and IS1 and drains of transistors PD1 (or drains of transistors PD1-2 and PD1-1) and PU1, and a node contact N2 couples together the sources of transistors PG2, PG4, and IS2 and drains of transistors PD2 (or drains of transistors PD2-2 and PD2-1) and PU2. A butted contact BC1 couples the source of isolation transistor IS1 to the gate of the isolation transistor IS1, and a butted contact BC2 couples the source of isolation transistor IS2 to the gate of the isolation transistor IS2.

Figure 14:
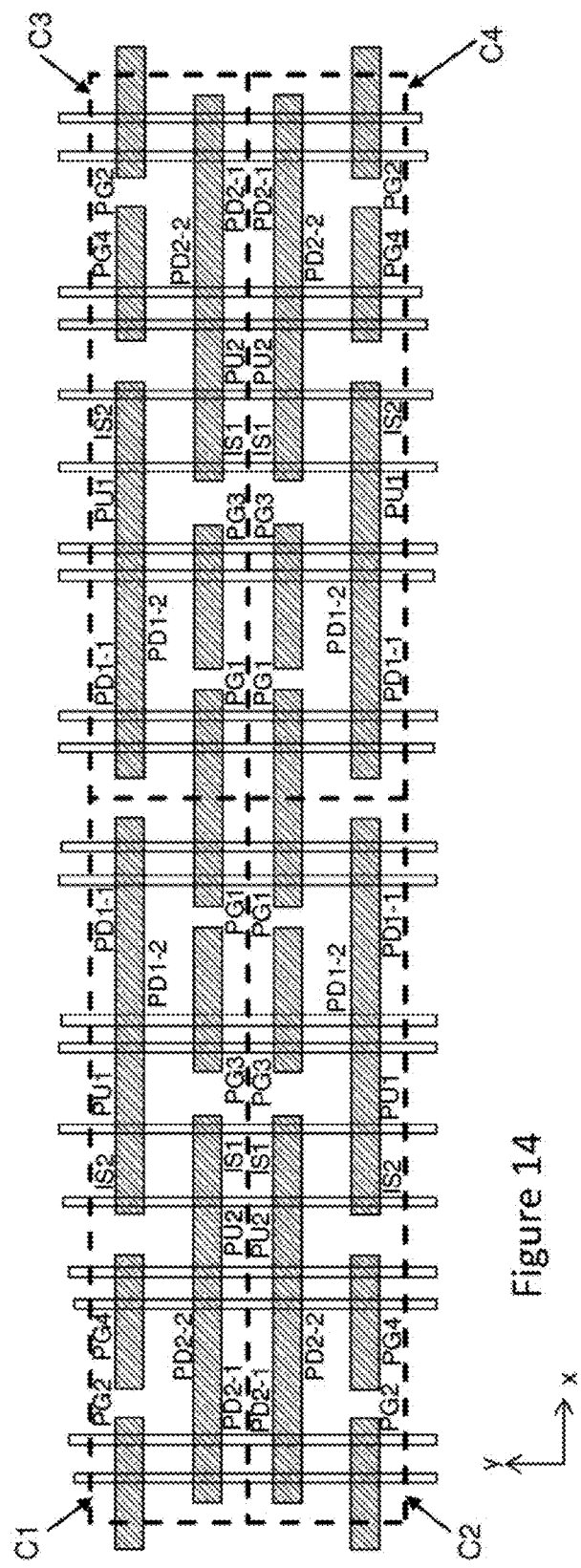
FIG. 14 is an example 2×2 array of bit cells with each bit cell using the bit cell layout of FIG. 13 according to an embodiment.

FIG. 14 depicts an example 2×2 array of bit cells C1, C2, C3, and C4, with each bit cell using the bit cell layout of FIG. 13 according to an embodiment. It should be noted that the bit cell layout of FIG. 13 or other layouts may be similarly used. For ease of reference, a column is referred to as being in the y-direction in this example. Thus, bit cells C1 and C2 are in a first column, and bit cells C3 and C4 are in a second column. As depicted, adjacent cells in the array are mirror images along a border between the adjacent cells.

Each active area in a bit cell extends through multiple bit cells in a column. In an embodiment, each active area in a bit cell extends through all of the bit cells in a column. In other embodiments, each active area extends through less than all of the bit cells in the column. In FIG. 14, the active area for transistors IS1 and PU1 in bit cell C1 extends through bit cell C2 as the active area for transistors PU1 and IS1. In this configuration, the drains of the isolation transistors IS1 in adjacent bit cells C1 and C2 are coupled together (such as depicted in FIG. 12 between bit cells C1 and C2) because the drains share a common node along the same active area. Similarly, the active area for transistors IS1 and PU1 in bit cell C3 extends through bit cell C4 as the active area for transistors PU1 and IS1. Although not illustrated, each of the active areas of isolation transistors IS2 in each bit cell extends into an adjacent bit cell to be the active area of respective isolation transistors IS2 in the adjacent bit cell, thereby forming the coupling between isolation transistors IS2 in adjacent bit cells, as depicted in FIG. 12.

In operation, the bit cells in FIGS. 10 through 14 generally operate as a conventional dual port SRAM cell operates. When write operations are performed on a first port, pass-gate transistors PG1 and PG2 are turned on using the first word line AWL, and a voltage to which the first bit line ABL and the complementary first bit line ABLB are driven will be sensed through the pass-gate transistors PG1 and PG2 by the cross-coupled transistors PU1, PU2, PD1, and PD2. When write operations are performed on a second port, pass-gate transistors PG3 and PG4 are turned on using the second word line BWL, and a voltage to which the second bit line BBL and the complementary second bit line BBLB are driven will be sensed through the pass-gate transistors PG3 and PG4 by the cross-coupled transistors PU1, PU2, PD1, and PD2. The cross-coupled transistors PU1, PU2, PD1, and PD2 drive the storage nodes N1 and N2 to a high or low state based on the sensing (with the storage nodes N1 and N2 being complementary of each other). The data is thus written into the bit cell through bit lines ABL, ABLB, BBL, and BBLB. Conversely, when read operations are performed through a first port, pass-gate transistors PG1 and PG2 are turned on by the first word line AWL, and the data is read onto the first bit line ABL and complementary first bit line ABLB through the pass-gate transistors PG1 and PG2. When read operations are performed through a second port, pass-gate transistors PG3 and PG4 are turned on by the second word line BWL, and the data is read onto the second bit line BBL and complementary second bit line BBLB through the pass-gate transistors PG3 and PG4.

As previously discussed with respect to FIGS. 1 through 5, the isolation transistors IS1 and IS2 in FIGS. 10 through 14 may have a negligible effect on the operation of the bit cell. During operation, current generally may not flow through the isolation transistors IS1 and IS2, and in some instances, a small amount of leakage may flow through the isolation transistor IS1 or IS2 when the voltage at the node is switched, e.g., from low to high and vice versa. With fast switching times and/or low voltages, the leakage current can be very small and negligible.

By having the bit cells in the configuration in FIG. 14, active areas can be more uniformly spaced and can uniformly extend throughout an array of bit cells, as discussed with reference to FIG. 5. Further, the active areas can extend longitudinally across multiple bit cells without being interrupted by an isolation area.

Figure 15A:
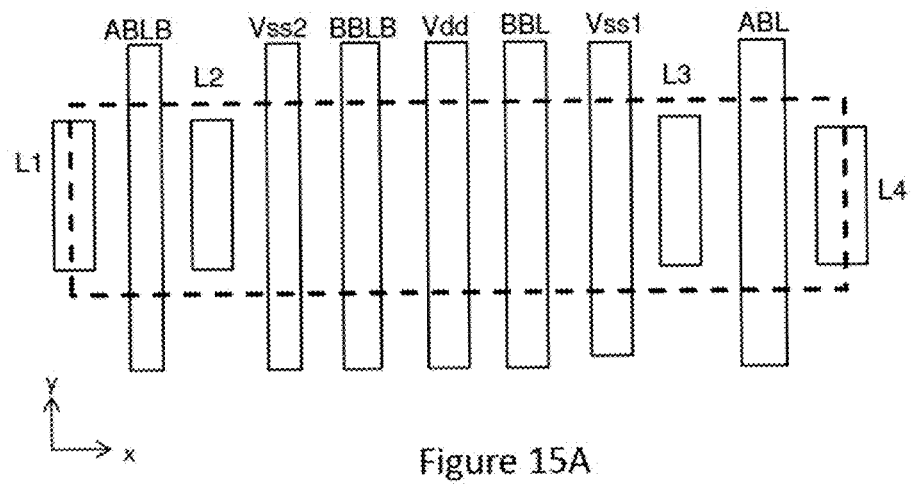
FIGS. 15A and 15B are an example of metallization patterns for the bit cell layout in FIG. 13 according to an embodiment.
Figure 15B:
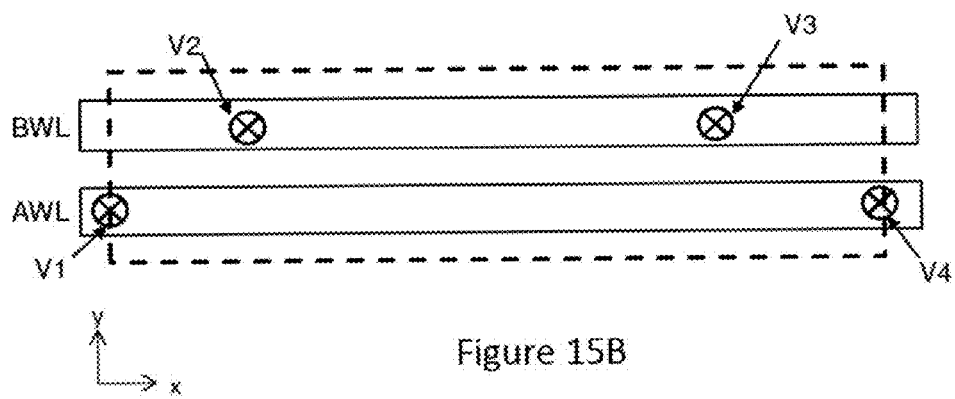

FIGS. 15A and 15B illustrate an example of metallization patterns for the bit cell layout in FIG. 13. The dashed rectangles in these figures indicate a boundary of the bit cell that corresponds to the boundary shown in FIGS. 13. These are an example pattern, and a person having ordinary skill in the art will readily appreciate various modifications to the example or different patterns that are contemplated within the scope of embodiments.

FIG. 15A is a first metallization pattern M1 in a first inter-metal dielectric layer IMD1, and FIG. 15B is a second metallization pattern M2 in a second inter-metal dielectric layer IMD2 overlying the first inter-metal dielectric layer IMD1. In FIG. 15A, the first metallization pattern M1 includes a first bit line trace ABL, a first ground trace Vss1, a second bit line trace BBL, a power trace Vdd, a complementary second bit line trace BBLB, a second ground trace Vss2, and a first complementary bit line trace ABLB, each trace extending longitudinally in the y-direction, which in the context of FIG. 14 is along a column. The first metallization pattern M1 further includes four landing pads L1, L2, L3, and L4. Although not expressly shown, a person having ordinary skill in the art will readily understand that vias extend below and from the first metallization pattern M1 to the respective contacts shown in the bit cell layout in FIG. 13. In FIG. 15B, the second metallization pattern M2 includes a first word line trace AWL and a second word line trace BWL, each extending longitudinally in the x-direction, which in the context of FIG. 14 is along a row. Vias V1, V2, V3, and V4 extend below and from the second metallization pattern M2 to respective landing pads L1, L2, L3, and L4 in the first metallization pattern M1. Each of the traces in FIGS. 15A and 15B can transverse multiple cells in the respective directions in which the traces longitudinally extend.

Figure 16:
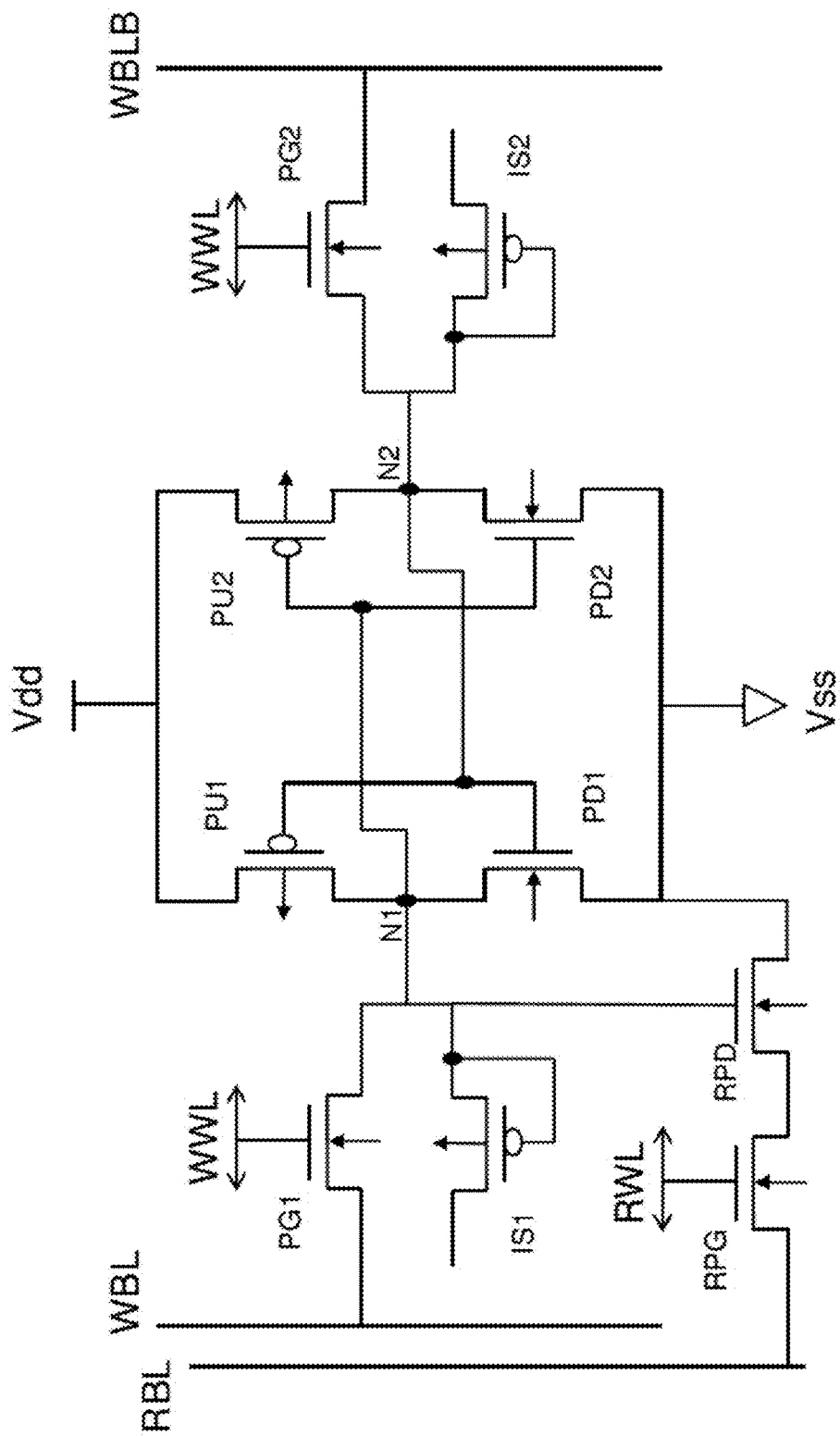
FIG. 16 is a circuit diagram of a two port SRAM bit cell according to an embodiment.

FIG. 16 illustrates a circuit diagram of a two port SRAM bit cell according to an embodiment. The cell includes pull-up transistors PU1 and PU2, pull-down transistors PD1 and PD2, pass-gate transistors PG1 and PG2, a read pass-gate transistor RPG, a read pull-down transistor RPD, and isolation transistors IS1 and IS2. As show in the circuit diagram, transistors PU1, PU2, IS1, and IS2 are p-type transistors, such as planar PFETs or p-type finFETs, and transistors PD1, PD2, PG1, PG2, RPD, and RPG are n-type transistors, such as planar NFETs or n-type finFETs.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a data latch. The gates of transistors PU1 and PD1 are coupled together and to the drains of transistors PU2 and PD2, and the gates of transistors PU2 and PD2 are coupled together and to the drains of transistors PU1 and PD1. Sources of the pull-up transistors PU1 and PU2 are coupled to power voltage Vdd, and the sources of the pull-down transistors PD1 and PD2 are coupled to a ground voltage Vss.

Storage node N1 of the data latch is coupled to write bit line WBL through pass-gate transistor PG1, and storage node N2 is coupled to complementary write bit line WBLB through pass-gate transistor PG2. Storage nodes N1 and N2 are complementary nodes that are often at opposite logic levels (logic high or logic low). Gates of pass-gate transistors PG1 and PG2 are coupled to write word line WWL. The source of the read pull-down transistor RPD is coupled to the ground voltage VSS, and the gate of the read pull-down transistor RPD is coupled to the storage node N1. The drain of the read pull-down transistor RPD is coupled to the source of the read pass-gate transistor RPG. The gate of transistor RPG is coupled to a read word line RWL, and the drain of transistor RPG is coupled to a read bit line RBL. The source and gate of the isolation transistor IS1 are coupled together and to the storage node N1, and the source and gate of the isolation transistor IS2 are coupled together and to the storage node N2. Drains of the isolation transistors IS1 and IS2 are depicted as floating, but may be coupled to respective isolation transistors in adjacent cells, as will be discussed.

Figure 17:
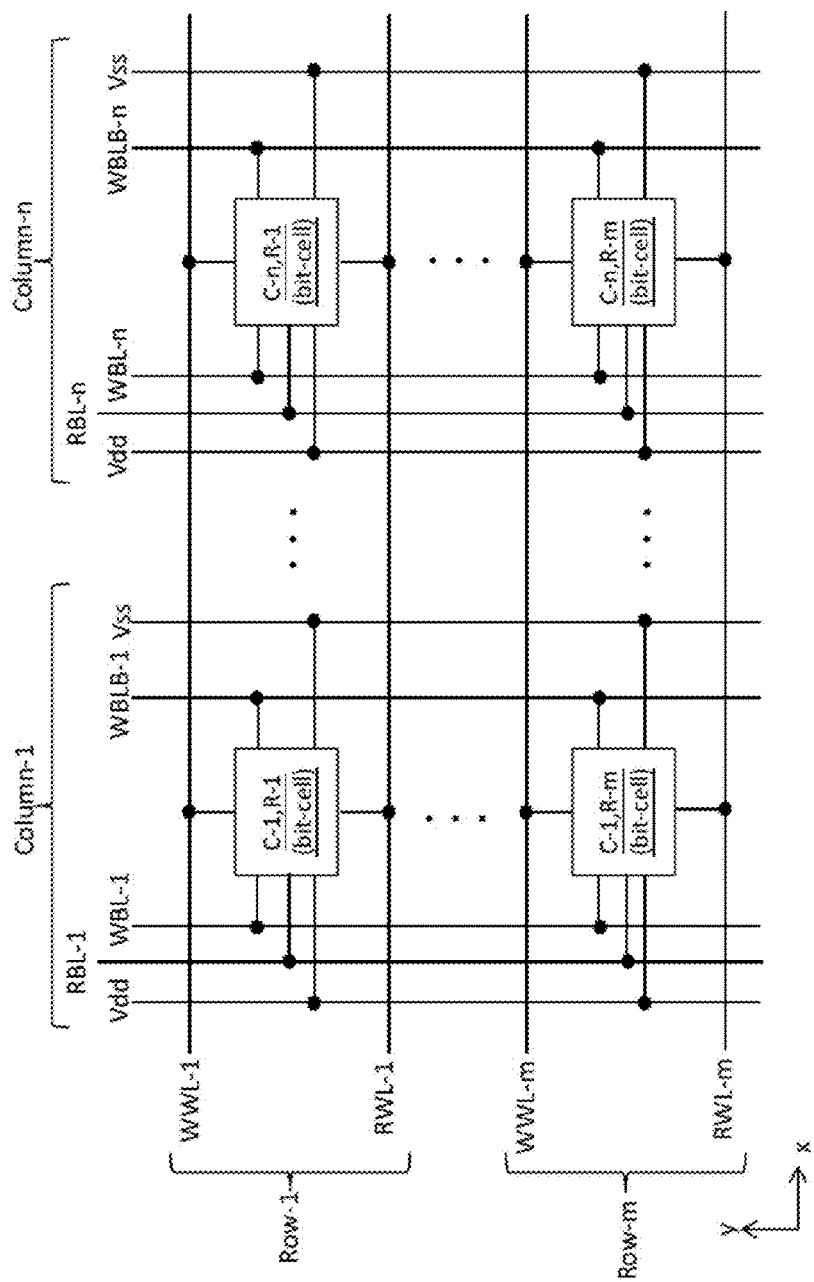
FIG. 17 is an array of bit cells, one example of a bit cell being depicted in FIG. 16, according to an embodiment.

FIG. 17 is an array of bit cells, one example of a bit cell being depicted in FIG. 16. The array has n number of columns and m number of rows. The array comprises mxn number of bit cells, with m number of bit cells in each column and n number of bit cells in each row. Each column has a write bit line WBL-n, a complementary write bit line WBLB-n, and a read bit line RBL-n, and each row has a write word line WWL-m and a read word line RWL-m. As a person having ordinary skill in the art will readily understand, a selection of a word line and a bit line will read from or write to a bit cell at the intersection of the selected word line and bit line. A power line Vdd and a ground line Vss are depicted in each column, but these lines may be in each row or in a combination of a row and a column.

Figure 18:
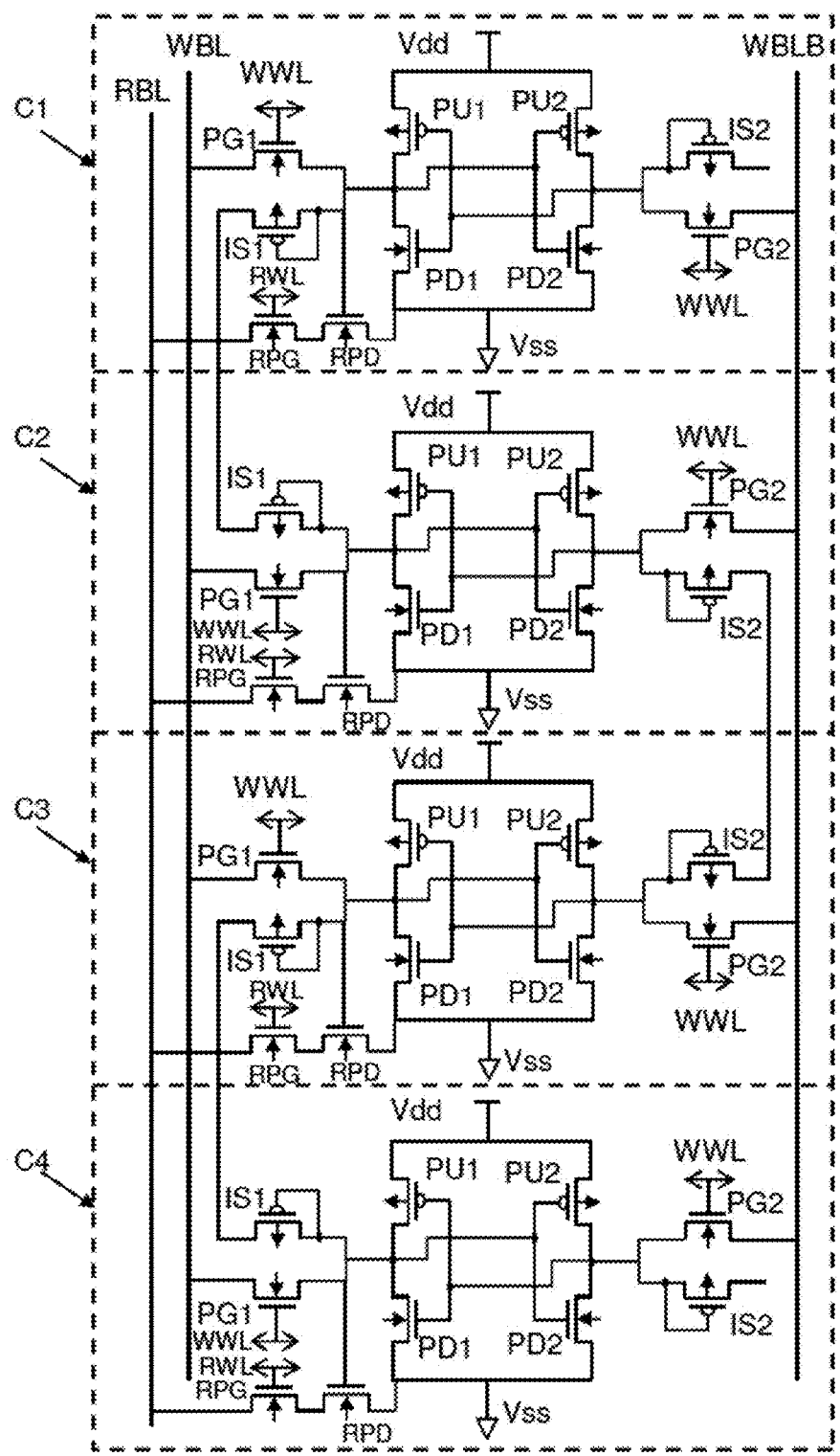
FIG. 18 is an example of a four bit cell column comprising bit cells in FIG. 16 according to an embodiment.

FIG. 18 is an example of a four bit cell column according to an embodiment. The column, as depicted, comprises four bit cells C1, C2, C3, and C4, each of which being the bit cell in FIG. 16 with boundaries indicated by the dashed lines. The write bit line WBL, complementary write bit line WBLB, and read bit line RBL extend through each bit cell C1, C2, C3, and C4, as indicated in FIG. 17. The drain of the isolation transistor IS1 in each cell is coupled to the drain of another isolation transistor IS1 in an adjacent cell. For example, the drain of isolation transistor IS1 in bit cell C1 is coupled to the drain of isolation transistor IS1 in bit cell C2, and the drain of isolation transistor IS1 in bit cell C3 is coupled to the drain of isolation transistor IS1 in bit cell C4. Further, the drain of the isolation transistor IS2 in each cell is coupled to the drain of another isolation transistor IS2 in an adjacent cell. For example, the drain of isolation transistor IS2 in bit cell C2 is coupled to the drain of isolation transistor IS2 in bit cell C3. A person having ordinary skill in the art will readily understand that the drains of the isolation transistors IS2 in bit cells C1 and C4 can be coupled to isolation transistors in further adjacent cells, although four cells are depicted for illustration purposes. Isolation transistors IS1 or IS2 in cells at a beginning or end of a column can be coupled to transistors in dummy cells and/or left in a floating state.

Figure 19:
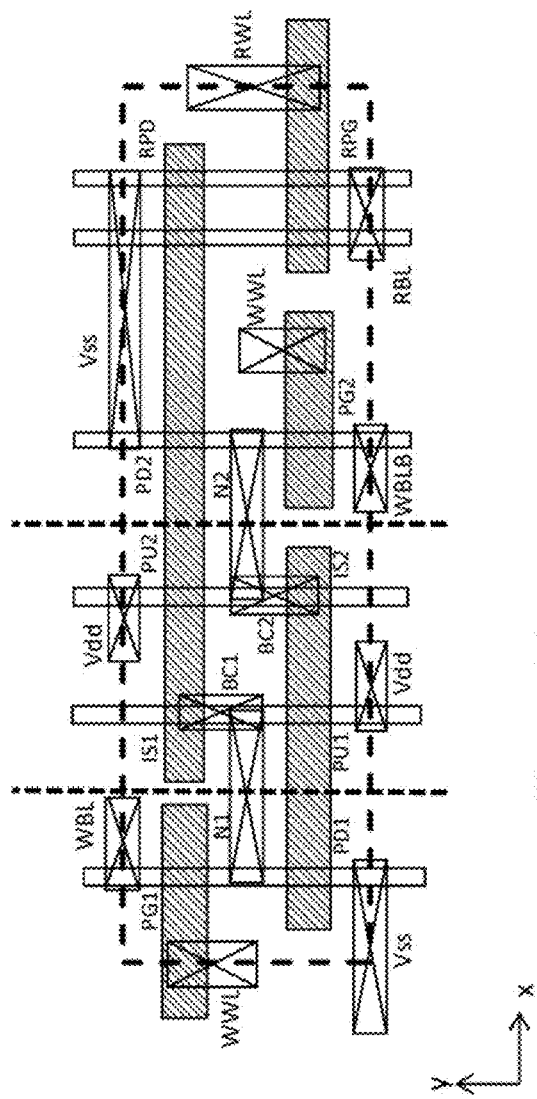
FIG. 19 is an example bit cell layout for the bit cell in FIG. 16 according to an embodiment.

FIG. 19 illustrates an example bit cell layout for the bit cell in FIG. 16 according to an embodiment. In FIG. 19, six active areas that make up the source/drain regions and channel regions of the various transistors extend longitudinally parallel across the width of the bit cell. For reference, longitudinal axes of the active areas extend in the y-direction of the bit cell. Five gate patterns of the various transistors extend longitudinally parallel along the length, e.g., the x-direction, of the bit cell. It should be noted that the terms width and length and the various directions are used for ease of reference and do not imply that a cell requires any particular dimensions or orientation. For further ease of reference, the dashed rectangle (as opposed to the two dashed lines intersecting the dashed rectangle) circumscribing the bit cell indicates a boundary of the bit cell.

The dashed lines that intersect the cell indicate boundaries between a p-type well in the substrate and an n-type well in the substrate in which respective active areas are formed. The active area of transistors PG1 and PD1 is formed in a p-type well, as these transistors are n-type transistors. The two active areas of transistors IS1, PU1, PU2, and IS2 are formed in an n-type well, as these transistors are p-type transistors. The three active areas of transistors PG2, PD2, RPD, and RPG are formed in a p-type well, as these transistors are n-type transistors.

As depicted transistors RPD and RPG are double pitch transistors, and the other transistors are single pitch. FIG. 19 is an example layout, and various transistors can be single or multiple pitch transistors.

A single gate pattern is used as the gates of transistors PD1, PU1, and IS2, and another single gate pattern is used as the gates of transistors PD2, PU2, IS1, and RPD. In this manner, each single gate pattern electrically couples the gates of the respective transistors. A gate pattern for pass-gate transistor PG1 extends beyond a cell boundary so that the gate pattern can be shared by an adjacent bit cell, as does a gate pattern for read pass-gate transistor RPG. A gate pattern for pass-gate transistor PG2 is internal to the bit cell and does not extend to another transistor.

Various contacts couple components in the bit cell. A write word line contact WWL is coupled to the gate of pass-gate transistor PG1, and another write word line contact WWL is coupled to the gate of pass-gate transistor PG2. A read word line contact RWL is coupled to the gate of read pass-gate transistor RPG. A write bit line contact WBL is coupled to a drain of pass-gate transistor PG1, and a complementary write bit line contact WBLB is coupled to drain of pass-gate transistor PG2. A read bit line contact RBL is coupled to drain of read pass-gate transistor RPG. A power contact Vdd is coupled to the source of pull-up transistor PU1, and another power contact Vdd is coupled to the source of pull-up transistor PU2. A ground contact Vss is coupled to the source of pull-down transistor PD1, and another ground contact Vss is coupled to the sources of transistors PD2 and RPD. A node contact N1 couples together the sources of transistors PG1 and IS1 and drains of transistors PD1 and PU1, and a node contact N2 couples together the sources of transistors PG2 and IS2 and drains of transistors PD2 and PU2. A butted contact BC1 couples the source of isolation transistor IS1 to the gate of the isolation transistor IS1, and a butted contact BC2 couples the source of isolation transistor IS2 to the gate of the isolation transistor IS2.

Figure 20:
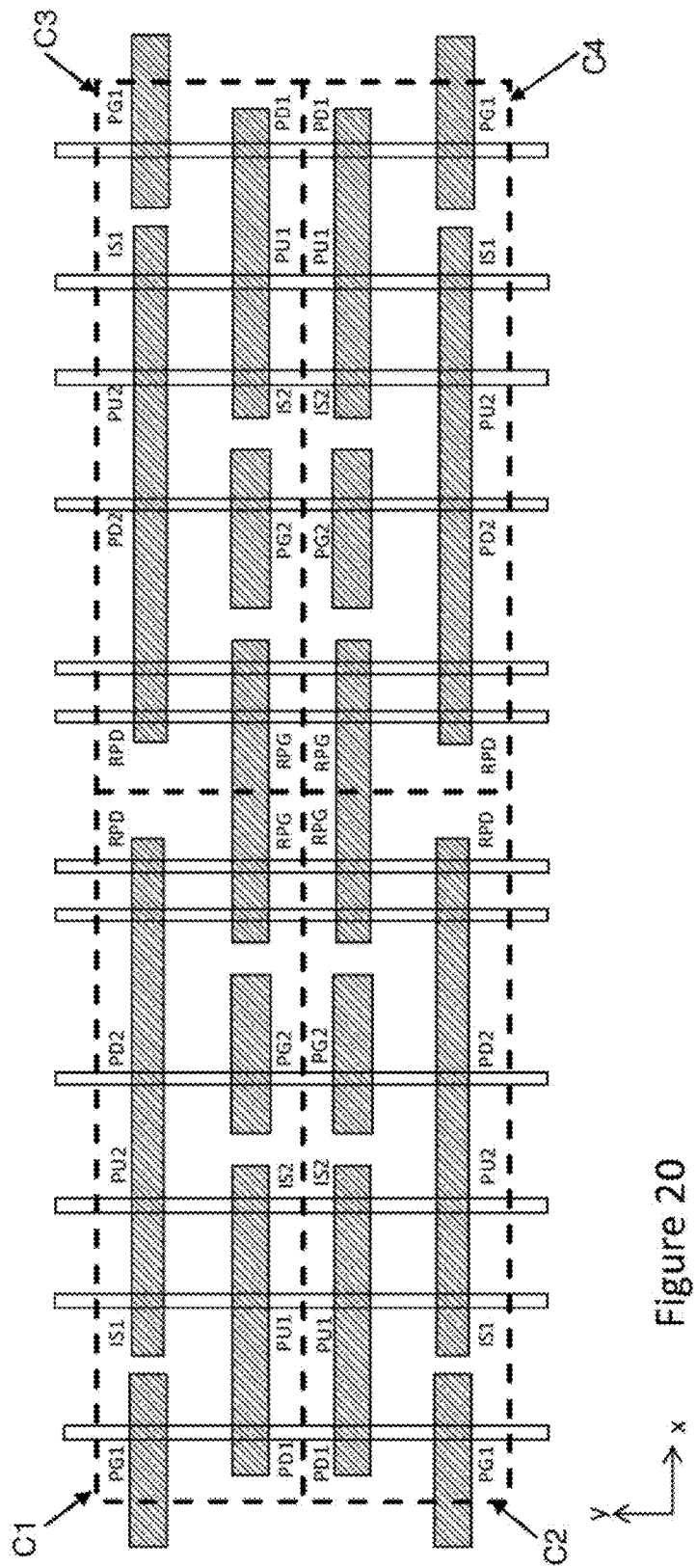
FIG. 20 is an example 2×2 array of bit cells with each bit cell using the bit cell layout of FIG. 19 according to an embodiment.

FIG. 20 depicts an example 2×2 array of bit cells C1, C2, C3, and C4, with each bit cell using the bit cell layout of FIG. 19 according to an embodiment. It should be noted that the bit cell layout of FIG. 19 or other layouts may be similarly used. For ease of reference, a column is referred to as being in the y-direction in this example. Thus, bit cells C1 and C2 are in a first column, and bit cells C3 and C4 are in a second column. As depicted, adjacent cells in the array are mirror images along a border between the adjacent cells.

Each active area in a bit cell extends through multiple bit cells in a column. In an embodiment, each active area in a bit cell extends through all of the bit cells in a column. In other embodiments, each active area extends through less than all of the bit cells in the column. In FIG. 20, the active area for transistors IS2 and PU2 in bit cell C1 extends through bit cell C2 as the active area for transistors PU2 and IS2. In this configuration, the drains of the isolation transistors IS2 in adjacent bit cells C1 and C2 are coupled together (such as depicted in FIG. 18 between bit cells C2 and C3) because the drains share a common node along the same active area. Similarly, the active area for transistors IS2 and PU2 in bit cell C3 extends through bit cell C4 as the active area for transistors PU2 and IS2. Although not illustrated, each of the active areas of isolation transistors IS1 in each bit cell extends into an adjacent bit cell to be the active area of respective isolation transistors IS1 in the adjacent bit cell, thereby forming the coupling between isolation transistors IS1 in adjacent bit cells, as depicted in FIG. 18.

In operation, the bit cells in FIGS. 16 through 20 generally operate as a conventional two port SRAM cell operates. When write operations are performed on a write port, pass-gate transistors PG1 and PG2 are turned on using the write word line WWL, and a voltage to which the write bit line WBL and the complementary write bit line WBLB are driven will be sensed through the pass-gate transistors PG1 and PG2 by the cross-coupled transistors PU1, PU2, PD1, and PD2. The cross-coupled transistors PU1, PU2, PD1, and PD2 drive the storage nodes N1 and N2 to a high or low state based on the sensing (with the storage nodes N1 and N2 being complementary of each other). The data is thus written into the bit cell through bit lines WBL and WBLB. Conversely, when read operations are performed through a read port, read pass-gate transistor RPG is turned on by the read word line RWL, and the data is read onto the read bit line RBL through the transistor RPG.

As previously discussed with respect to FIGS. 1 through 5, the isolation transistors IS1 and IS2 in FIGS. 16 through 20 may have a negligible effect on the operation of the bit cell. During operation, current generally may not flow through the isolation transistors IS1 and IS2, and in some instances, a small amount of leakage may flow through the isolation transistor IS1 or IS2 when the voltage at the node is switched, e.g., from low to high and vice versa. With fast switching times and/or low voltages, the leakage current can be very small and negligible.

By having the bit cells in the configuration in FIG. 20, active areas can be more uniformly spaced and can uniformly extend throughout an array of bit cells, as discussed with reference to FIG. 5. Further, the active areas can extend longitudinally across multiple bit cells without being interrupted by an isolation area.

Figure 21A:
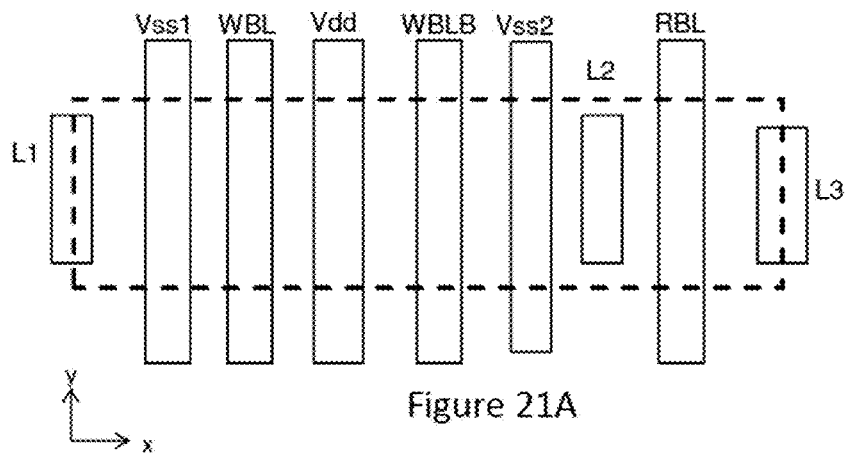
FIGS. 21A and 21B are an example of metallization patterns for the bit cell layout in FIG. 19 according to an embodiment.
Figure 21B:
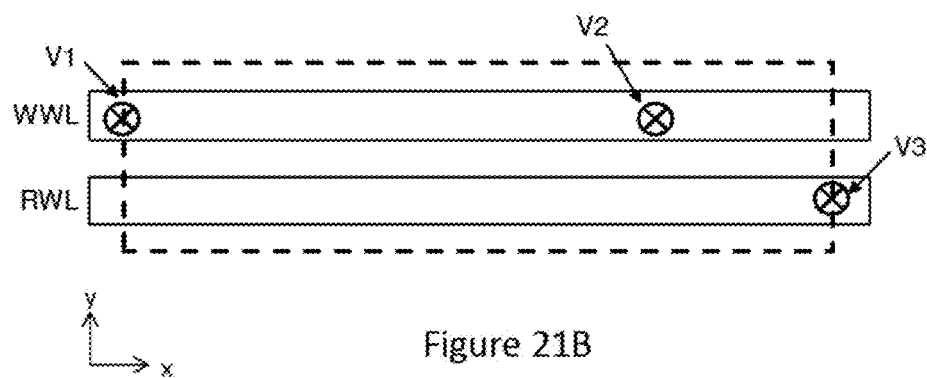

FIGS. 21A and 21B illustrate an example of metallization patterns for the bit cell layouts in FIG. 19. The dashed rectangles in these figures indicate a boundary of the bit cell that corresponds to the boundary shown in FIGS. 19. These are an example pattern, and a person having ordinary skill in the art will readily appreciate various modifications to the example or different patterns that are contemplated within the scope of embodiments.

FIG. 21A is a first metallization pattern M1 in a first inter-metal dielectric layer IMD1, and FIG. 21B is a second metallization pattern M2 in a second inter-metal dielectric layer IMD2 overlying the first inter-metal dielectric layer IMD1. In FIG. 21A, the first metallization pattern M1 includes a first ground trace Vss1, a write bit line trace WBL, a power trace Vdd, a complementary write bit line trace WBLB, a second ground trace Vss2, and a read bit line trace RBL, each trace extending longitudinally in the y-direction, which in the context of FIG. 20 is along a column. The first metallization pattern M1 further includes three landing pads L1, L2, and L3. Although not expressly shown, a person having ordinary skill in the art will readily understand that vias extend below and from the first metallization pattern M1 to the respective contacts shown in the bit cell layout in FIG. 19. In FIG. 21B, the second metallization pattern M2 includes a write word line trace WWL and a read word line trace RWL, each extending longitudinally in the x-direction, which in the context of FIG. 20 is along a row. Vias V1, V2, and V3 extend below and from the second metallization pattern M2 to respective landing pads L1, L2, and L3 in the first metallization pattern M1. Each of the traces in FIGS. 21A and 21B can transverse multiple cells in the respective directions in which the traces longitudinally extend.

Figure 22:
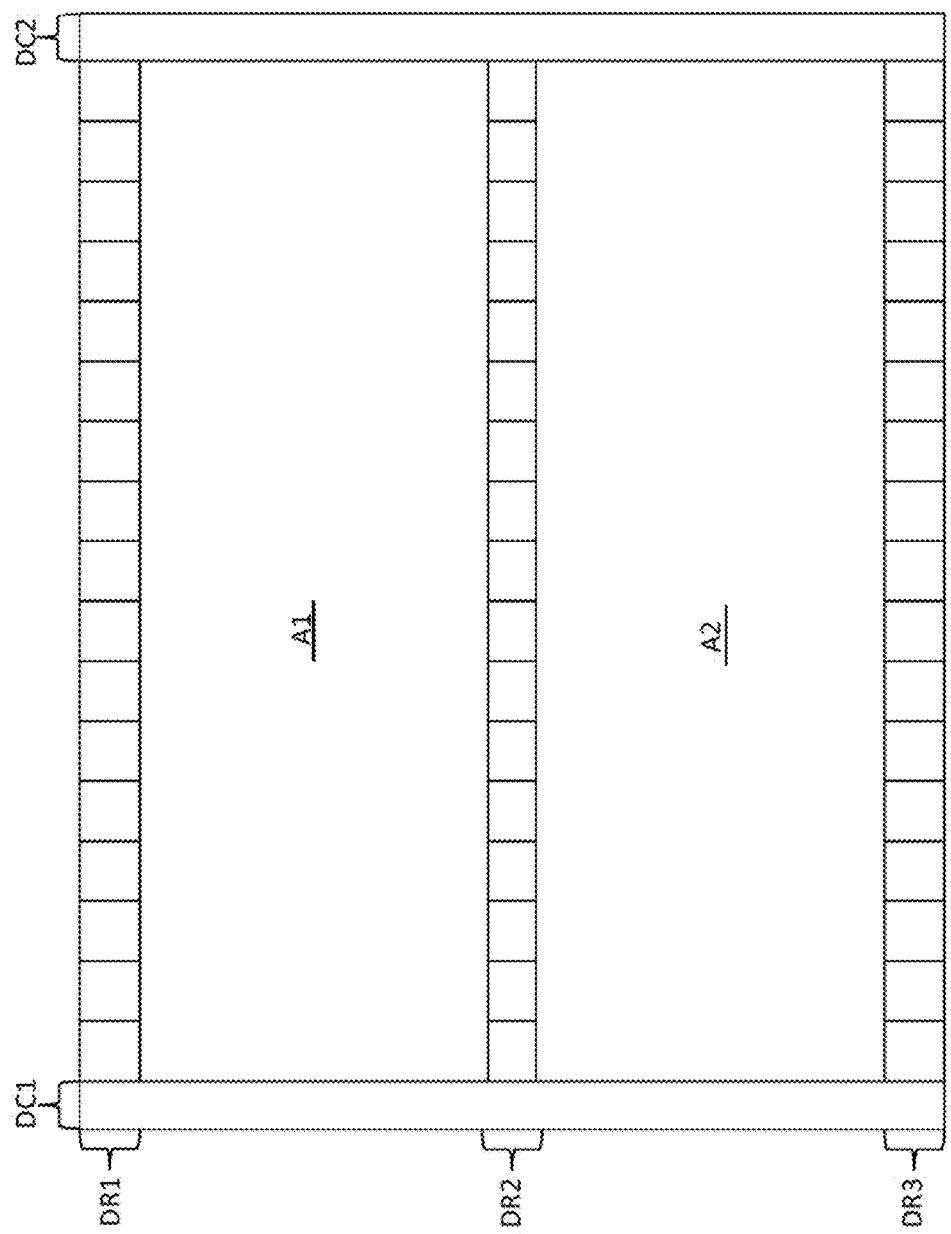
FIG. 22 is a memory layout according to an embodiment.

FIG. 22 illustrates a memory layout according to an embodiment. The memory layout comprises a first array of bit cells A1 and a second array of bit cells A2. The arrays A1 and A2 are each surrounded by dummy bit cells. For example, a first dummy column DC1 and a second dummy column DC2 are on opposite horizontal sides of each array A1 and A2. A first dummy row DR1 and a second dummy row DR2 are on opposite vertical sides of array A1, and the second dummy row DR2 and a third dummy row DR3 are on opposite vertical sides of array A2. Various patterns of dummy rows or columns can be dispersed throughout a memory layout. Dummy bit cells in this configuration can allow edge effects, such as from lithography patterning, to be absorbed by the dummy cells rather than by operational memory bit cells.

FIGS. 23 through 31 illustrate a method of forming a memory array comprising finFETs according to an embodiment. Although the method is discussed specifically with regard to the bit cells of FIGS. 4A and 5 and the metallization patterns of FIGS. 7A and 7B, a person having ordinary skill in the art will readily appreciate the applicability and any modifications for forming other bit cells and/or metallization patterns. Also, a person having ordinary skill in the art will readily understand the applicability of embodiments using planar transistors. Further, although the method is discussed in a particular order, other embodiments may be performed in any logical order.

Figure 23:
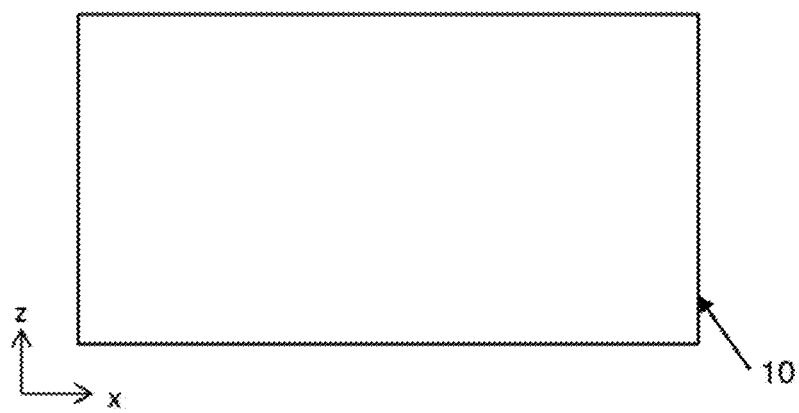
FIGS. 23 through 31 are a method of forming a memory array comprising fin field effect transistors (finFETs) according to an embodiment.
Figure 24:
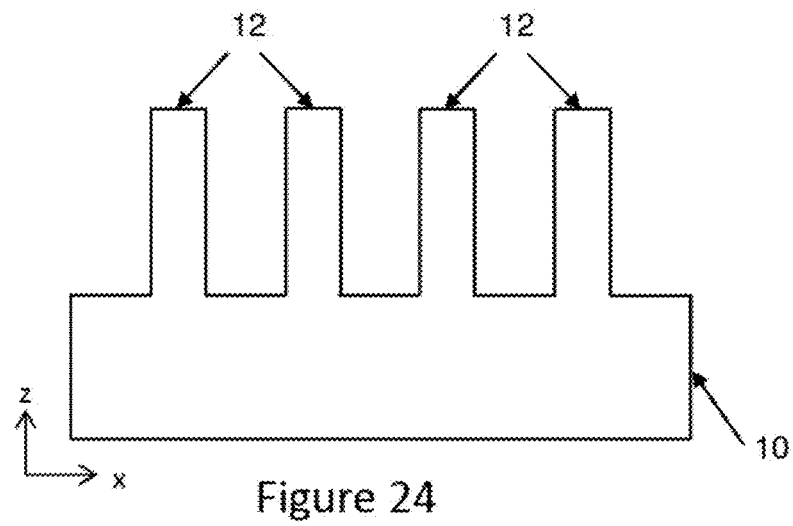
Figure 25:
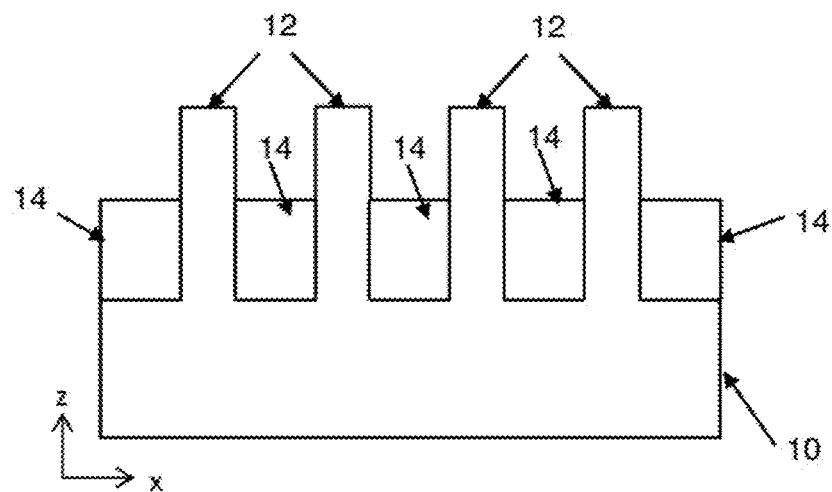

FIGS. 23 through 25 illustrate process steps in a cross section view, for example, along an x-z plane in a bit cell. In FIG. 23, a substrate 10 is provided, such as a semiconductor substrate, a semiconductor on insulator (SOI) substrate, or the like. In an embodiment, the substrate is a bulk silicon substrate. The substrate 10 may be doped to form wells of appropriate dopant types and concentrations in areas of the substrate 10 where finFETs will be formed.

In FIG. 24, the substrate 10 is etched to form fins 12. The fins 12 may be formed by depositing a mask layer over the substrate 10 and depositing a photoresist over the mask layer. The photoresist can be patterned into the fin pattern by appropriate exposure to light. The fin pattern is transferred to the mask layer by an etch, and the fin pattern is transferred from the mask layer to the substrate 10 by an etch. If an SOI substrate is used, the etch may be to a depth to the insulator or to a depth above or below the insulator.

In FIG. 25, isolation structures 14 are formed between fins 12. An insulating layer, such as a high density plasma oxide, can be deposited over the substrate 10 and fins 12 and etched back to form the isolation structures 14, according to acceptable deposition and lithography techniques. A person having ordinary skill in the art will readily understand other methods by which the fins 12 can be formed, and these methods are contemplated by embodiments. For example, an insulating layer can be formed over a substrate, trenches can be formed in the insulating layer exposing the substrate, and fins can be epitaxially grown from the substrate through the fins.

Figure 26:
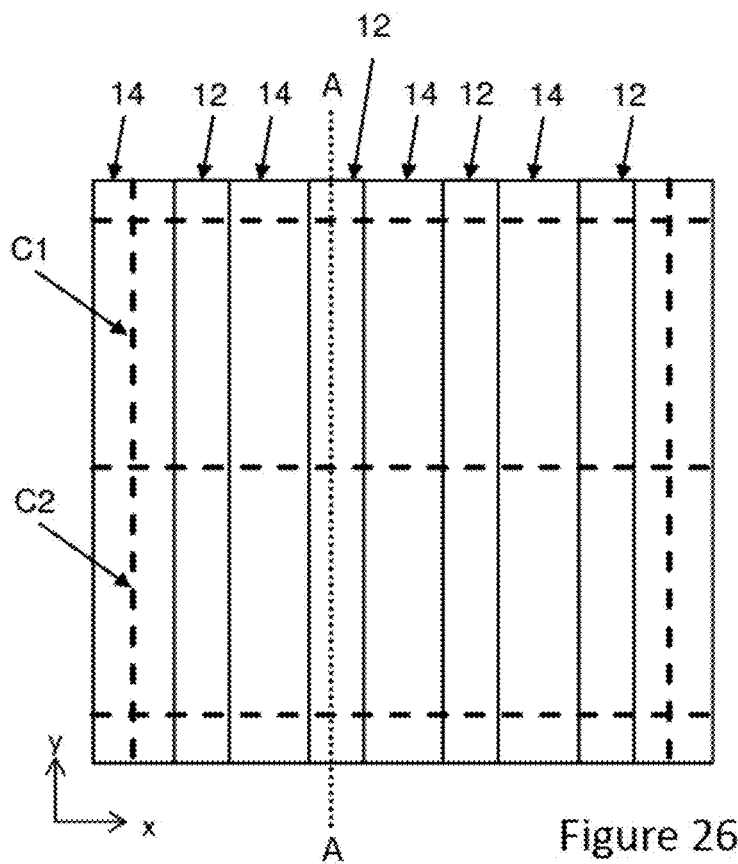

FIG. 26 is a layout view, for example, an x-y plane, of the fins 12 after the processing discussed with regard to FIG. 25. The layout corresponds, for example, to bit cells C1 and C2 in FIG. 5, although the layout can equally apply to other bit cells in an array. Dashed line A-A represents the cross section of the fin 12 illustrated in FIGS. 27 through 31.

Figure 27:
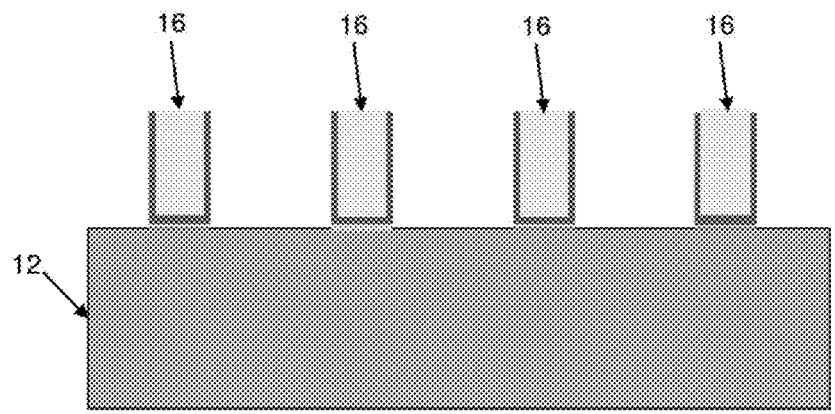

In FIG. 27, gate structures 16 are formed over the fin 12. The gate structures 16 may each include a gate dielectric, a gate electrode, and dielectric sidewall spacers. The gate dielectric and gate electrode can be formed by depositing a dielectric layer and an electrode layer sequentially on the substrate 10 (or fins 12) and etching the layers into the patterned gate dielectric and gate electrode. A dielectric layer can then be conformally deposited and etched to form the dielectric sidewall spacers. A person having ordinary skill in the art will readily understand acceptable materials and processes for forming these components.

Figure 28:
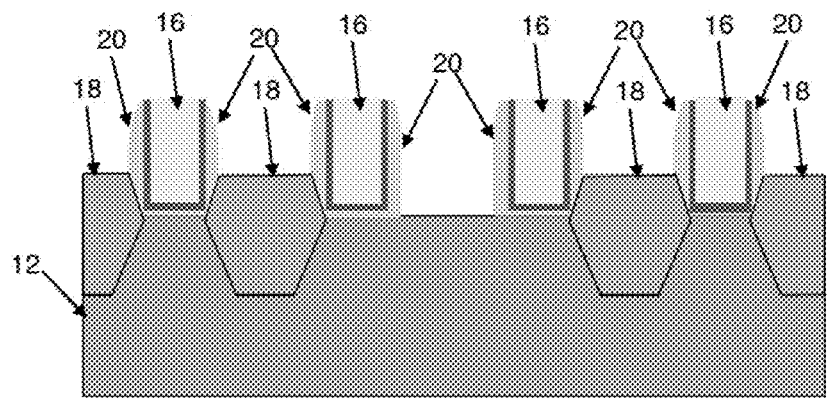

In FIG. 28, raised source/drain regions 18 are formed. The raised source/drain regions 18 can be formed by etching openings in the source/drain regions of the fin 12 and epitaxially growing the raised source/drain regions 18. The raise source/drain regions 18 can comprise, for example, silicon germanium (SiGe) for a p-type transistor or silicon carbon (SiC) for an n-type transistor, although other materials may be used. The raise source/drain regions 18 can be appropriately doped after the epitaxial growth or can be in situ doped during the growth. After the raised source/drain regions 18 are formed, an additional sidewall spacer 20 can be formed on the sidewalls of the gate structures 16. The spacers 20 can be formed by conformally depositing a dielectric layer over the substrate 10 and etching.

Figure 29:
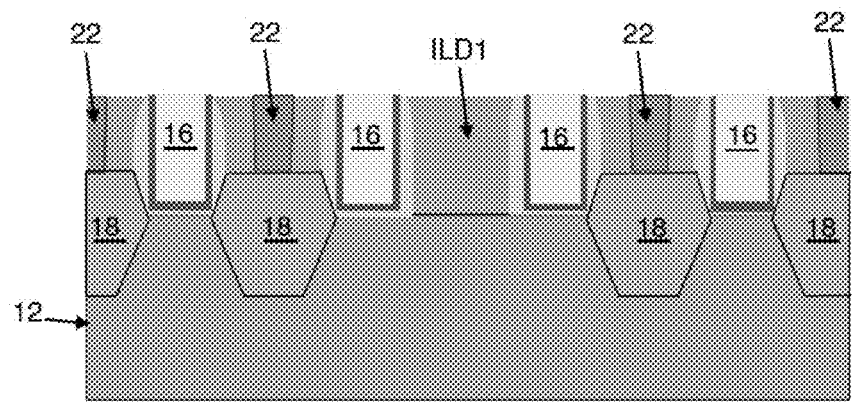

In FIG. 29, a first interlayer dielectric ILD1 is formed over the substrate 10 and fin 12. The interlayer dielectric ILD1 is planarized to a top surface of the gate structures 16, such as by a chemical mechanical polish (CMP). Contact openings are etched to the raised source/drain regions 18, and a conductive material is deposited in the contact openings and over the interlayer dielectric ILD1. The conductive material is planarized to a top surface of the interlayer dielectric ILD1, such as by a chemical mechanical polish (CMP), leaving conductive material in the contact openings to form contacts 22. The etching and deposition can be by any acceptable etching and deposition process, respectively. The contacts 22 can comprise any acceptable conductive material, such as a doped semiconductor or metal, such as copper, titanium, tungsten, aluminum, or the like. Further, a barrier layer may be formed between the conductive material and the interlayer dielectric ILD1, and an etch stop layer may be formed over the substrate 10 under the interlayer dielectric layer ILD1. A person having ordinary skill in the art will readily understand appropriate processes and materials used for forming these components.

Figure 30:
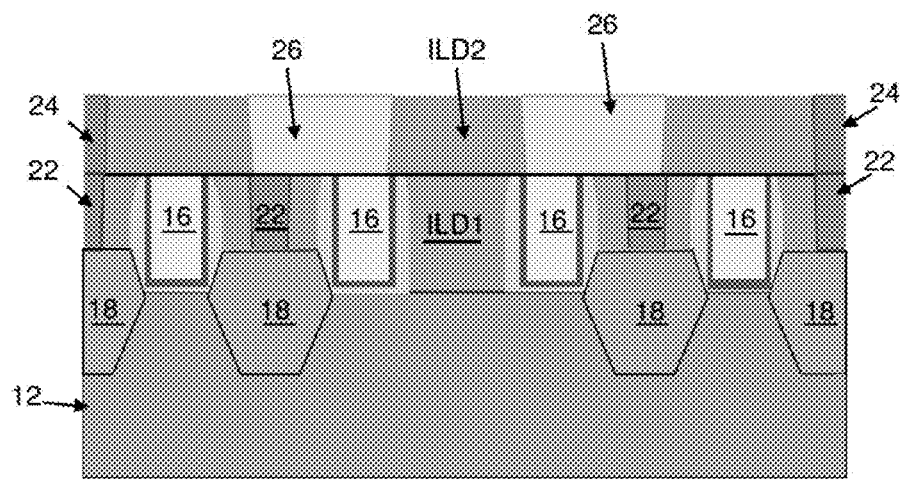

In FIG. 30, a second interlayer dielectric ILD2 is formed over the first interlayer dielectric ILD1, and butted contacts 26 and contacts 24 are formed in the second interlayer dielectric ILD2. The process and materials for forming these components is the same as or similar to those discussed with regard to FIG. 29, which would be readily appreciated by a person having ordinary skill in the art. Further, although not expressly depicted, an etch stop layer may be between the first interlayer dielectric ILD1 and the second interlayer dielectric ILD2.

In other embodiments, one interlayer dielectric layer can take the place of the two interlayer dielectrics ILD1 and ILD2, and the contacts 22, 24, and 26 can have openings formed from a single etch step and single deposition step.

Figure 31:
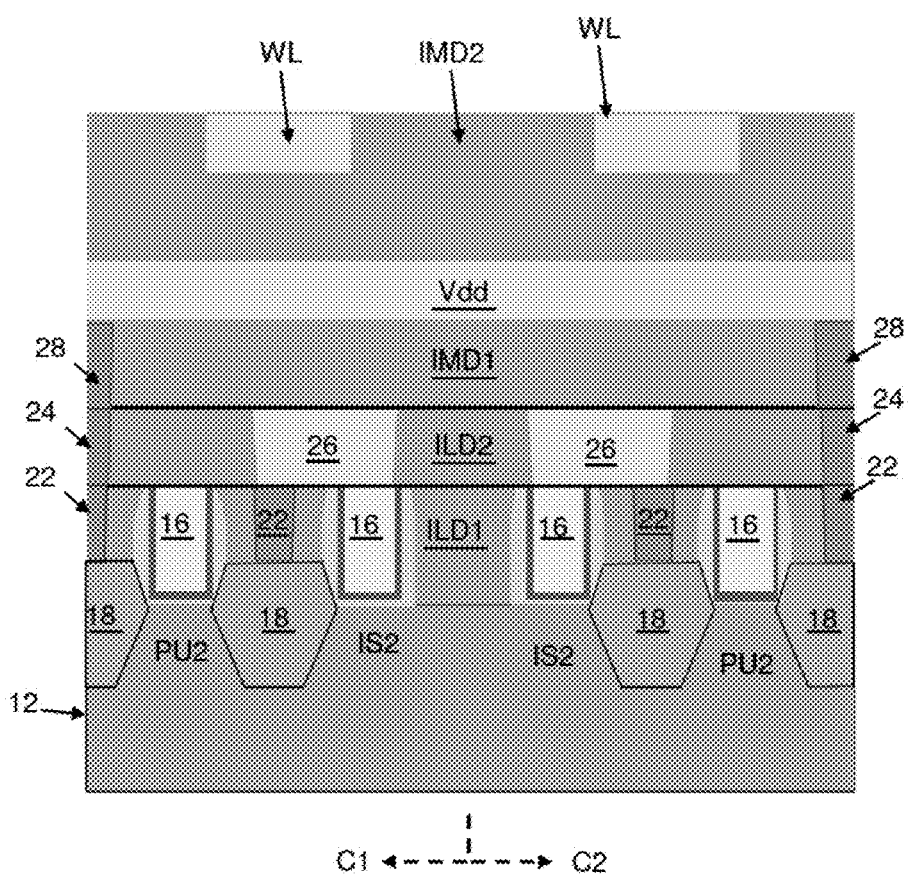

In FIG. 31, a first intermetal dielectric layer IMD1 is formed over the first interlayer dielectric layer ILD1, and a first metallization layer M1, illustrated by power trace Vdd, is formed in the first inter-metal dielectric layer IMD1. Vias 28 are formed in the first inter-metal dielectric layer IMD1 to the contacts 24 in the interlayer dielectric layer ILD2. A second intermetal dielectric layer IMD2 is formed over the first intermetal dielectric layer IMD1, and a second metallization layer M2, illustrated by word line traces WL, is formed in the second inter-metal dielectric layer IMD2. Vias (not depicted) are formed in the second inter-metal dielectric layer IMD2 to the landing pads in the first metallization layer M2. The inter-metal dielectric layers IMD1 and IMD2 can be formed by acceptable deposition techniques and with appropriate dielectric materials. The metallization layers M1 and M2 and vias can be formed using a single or dual damascene process and with appropriate materials, such as a metal, such as copper, titanium, tungsten, aluminum, or the like. An etch stop layer can be formed between the interlayer dielectric layer ILD2 and the inter-metal dielectric layer IMD1 and between the inter-metal dielectric layers IMD1 and IMD2. Further, barrier layers can be formed between the inter-metal dielectric layer and the conductive material of the metal patterns and vias. Further metallization layers and dielectric layers can be formed over the second inter-metal dielectric layer IMD2.

The cross section view of FIG. 31 corresponds to a structure with the layout in FIGS. 4A and 5 and the metallization patterns in FIGS. 7A and 7B. A person having ordinary skill in the art will readily understand the correspondence of these figures to the two bit cells C1 and C2 in FIG. 31.

A first embodiment is a memory cell comprising a first pull-up transistor, a first pull-down transistor, a second pull-up transistor, a second pull-down transistor, a first pass-gate transistor, a second pass-gate transistor, a first isolation transistor, and a second isolation transistor. A drain of the first pull-up transistor is electrically coupled to a drain of the first pull-down transistor at a first node. A drain of the second pull-up transistor is electrically coupled to a drain of the second pull-down transistor at a second node. A gate of the second pull-up transistor and a gate of the second pull-down transistor are electrically coupled to the first node, and a gate of the first pull-up transistor and a gate of the first pull-down transistor are electrically coupled to the second node. The first pass-gate transistor is electrically coupled to the first node, and the second pass-gate transistor is electrically coupled to the second node. The first isolation transistor is electrically coupled to the first node, and the second isolation transistor is electrically coupled to the second node.

Another embodiment is a memory array. The memory array comprises a first memory cell and a second memory cell. The first memory cell comprises a first set of transistors, and the second memory cell comprises a second set of transistors. Each of the first and second set of transistors comprises a first pull-up transistor, a first pull-down transistor, a second pull-up transistor, a second pull-down transistor, a first pass-gate transistor, a second pass-gate transistor, a first isolation transistor, and a second isolation transistor. An active area of each one transistor of the first set of transistors extends beyond a boundary of the first memory cell and into the second memory cell, and the boundary is shared by the first memory cell and the second memory cell.

A further embodiment is a method for forming a memory array. The method comprises forming a first fin, a second fin, a third fin, and a fourth fin; and forming a first pull-up transistor, a second pull-up transistor, a first pull-down transistor, a second pull-down transistor, a first pass-gate transistor, a second pass-gate transistor, a first isolation transistor, and a second isolation transistor in each of a first memory cell area and a second memory cell area. Each of the first fin, second fin, third fin, and fourth fin extends across the first memory cell area and the second memory cell area. The first pull-up transistor and the first isolation transistor of each of the first memory cell area and the second memory cell area comprise the first fin. The second pull-up transistor and the second isolation transistor of each of the first memory cell area and the second memory cell area comprise the second fin. The first pass-gate transistor and the first pull-down transistor of each of the first memory cell area and the second memory cell area comprise the third fin. The second pass-gate transistor and the second pull-down transistor of each of the first memory cell area and the second memory cell area comprisw the fourth fin.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory array comprising:
a first active area, a second active area, a third active area, and a fourth active area each traversing a first memory cell area and a second memory cell area, the first memory cell area being adjacent to the second memory cell area;
wherein in the first memory cell area:
the first active area is a component of a first pull-down transistor,
the second active area is a component of a first pull-up transistor, a drain of the first pull-up transistor being electrically coupled to a drain of the first pull-down transistor at a first node,
the third active area is a component of a first isolation transistor and a second pull-up transistor, and
the fourth active area is a component of a second pull-down transistor, a drain of the second pull-up transistor being electrically coupled to a drain of the second pull-down transistor at a second node, a gate of the second pull-up transistor and a gate of the second pull-down transistor being electrically coupled to the first node, a gate of the first pull-up transistor and a gate of the first pull-down transistor being electrically coupled to the second node;
wherein in the second memory cell area:
the first active area is a component of a third pull-down transistor,
the second active area is a component of a third pull-up transistor, a drain of the third pull-up transistor being electrically coupled to a drain of the third pull-down transistor at a third node,
the third active area is a component of a second isolation transistor and a fourth pull-up transistor, and
the fourth active area is a component of a fourth pull-down transistor, a drain of the fourth pull-up transistor being electrically coupled to a drain of the fourth pull-down transistor at a fourth node, a gate of the fourth pull-up transistor and a gate of the fourth pull-down transistor being electrically coupled to the third node, a gate of the third pull-up transistor and a gate of the third pull-down transistor being electrically coupled to the fourth node; and wherein the first isolation transistor and the second isolation transistor have a shared source/drain region at a boundary between the first memory cell area and the second memory cell area, the shared source/drain region not having a contact directly coupled thereto.

2. The memory array of claim 1, wherein:
in the first memory cell area:
the first active area is a component of a first pass-gate transistor, and
the fourth active area is a component of a second pass-gate transistor, and in the second memory cell area:
the first active area is a component of a third pass-gate transistor, and
the fourth active area is a component of a fourth pass-gate transistor.

3. The memory array of claim 1 further comprising a fifth active area and a sixth active area each traversing the first memory cell area and the second memory cell area,
wherein in the first memory cell area:
the fifth active area is a further component of the first pull-down transistor, and
the sixth active area is a further component of the second pull-down transistor, and
wherein in the second memory cell area:
the fifth active area is a further component of the third pull-down transistor, and
the sixth active area is a further component of the fourth pull-down transistor.

4. The memory array of claim 1, wherein each of the first active area, the second active area, the third active area, and the fourth active area comprises a fin active area.

5. The memory array of claim 1 further comprising a first metallization layer over the active areas and a second metallization layer over the first metallization layer, one of the first metallization layer or the second metallization layer comprising a bit line trace traversing the first memory cell area and the second memory cell area, the other of the first metallization layer or the second metallization layer comprising a first word line trace extending across the first memory cell area at a direction that intersects the bit line trace and a second word line trace extending across the second memory cell area at a direction that intersects the bit line trace.

6. The memory array of claim 5, wherein the one of the first metallization layer or the second metallization layer further comprises a power trace traversing the first memory cell area and the second memory cell area, and the other of the first metallization layer or the second metallization layer further comprises a first ground trace extending across the first memory cell area at a direction that intersects the bit line trace and a second ground trace extending across the second memory cell area at a direction that intersects the bit line trace.

7. The memory array of claim 5, wherein the one of the first metallization layer or the second metallization layer further comprises a power trace traversing the first memory cell area and the second memory cell area, and further comprises a ground trace traversing the first memory cell area and the second memory cell area.

8. The memory array of claim 5, wherein the one of the first metallization layer or the second metallization layer further comprises (i) a power trace traversing the first memory cell area and the second memory cell area, (ii) a first ground trace traversing the first memory cell area and the second memory cell area, and (iii) a second ground trace traversing the first memory cell area and the second memory cell area, and the other of the first metallization layer or the second metallization layer further comprises a ground mesh trace, a first via electrically coupling the ground mesh trace to the first ground trace, and a second via electrically coupling the ground mesh trace to the second ground trace.

9. The memory array of claim 1, further comprising a fifth active area and a sixth active area each traversing the first memory cell area and the second memory cell area,
wherein in the first memory cell area:
the first active area is a component of a first pass-gate transistor,
the fourth active area is a component of a second pass-gate transistor,
the fifth active area is a component of a third pass-gate transistor, and
the sixth active area is a component of a fourth pass-gate transistor, and
wherein in the second memory cell area:
the first active area is a component of a fifth pass-gate transistor,
the fourth active area is a component of a sixth pass-gate transistor,
the fifth active area is a component of a seventh pass-gate transistor, and
the sixth active area is a component of a eighth pass-gate transistor.

10. The memory array of claim 1, further comprising a fifth active area traversing the first memory cell area and the second memory cell area,
wherein in the first memory cell area:
the fifth active area is a component of a first read pass-gate transistor and a first read pull-down transistor, and
wherein in the second memory cell area:
the fifth active area is a component of a second read pass-gate transistor and a second read pull-down transistor.

11. A memory array comprising:
a first static random access memory (SRAM) cell area on a substrate; and
a second SRAM cell area on the substrate, the first SRAM cell area adjoining the second SRAM cell area at a boundary, a fin active area being in each of the first SRAM cell area and the second SRAM cell area and extending across the boundary, the fin active area being (i) a component of a first isolation transistor in the first SRAM cell area, (ii) a component of a first operational transistor in the first SRAM cell area, (iii) a component of a second isolation transistor in the second SRAM cell area, and (iv) a component of a second operational transistor in the second SRAM cell area.

12. The memory array of claim 11, wherein each of the first SRAM cell area and the second SRAM cell area comprises:
a first pull-down transistor,
a first pull-up transistor, a drain of the first pull-up transistor being electrically coupled to a drain of the first pull-down transistor at a first node, the first pull-up transistor in the first SRAM cell area being the first operational transistor, and the first pull-up transistor in the second SRAM cell area being the second operational transistor,
a second pull-up transistor, and
a second pull-down transistor, a drain of the second pull-up transistor being electrically coupled to a drain of the second pull-down transistor at a second node, a gate of the second pull-up transistor and a gate of the second pull-down transistor being electrically coupled to the first node, a gate of the first pull-up transistor and a gate of the first pull-down transistor being electrically coupled to the second node.

13. The memory array of claim 11, wherein each of the first SRAM cell area and the second SRAM cell area comprises a double pitch transistor.

14. The memory array of claim 11, wherein each of the first SRAM cell area and the second SRAM cell area comprises a dual port SRAM cell.

15. The memory array of claim 11, wherein each of the first SRAM cell area and the second SRAM cell area comprises a two-port SRAM cell.

16. A method comprising:
    forming a fin active area on a substrate, the fin active area extending across a boundary of a first static random access memory (SRAM) cell area into a second SRAM cell area;
    forming a first gate structure over the fin active area in the first SRAM cell area proximate the boundary and a second gate structure over the fin active area in the second SRAM cell area proximate the boundary;
    forming a dielectric layer over the fin active area, the first gate structure, and the second gate structure; and
    forming a first contact through the dielectric layer to a source/drain region of the fin active area in the first SRAM cell area and a second contact through the dielectric layer to a source/drain region of the fin active area in the second SRAM cell area, the first contact being on an opposite side of the first gate structure from the boundary, the second contact being on an opposite side of the second gate structure from the boundary, no contact being formed to a region of the fin active area at the boundary between the first gate structure and the second gate structure.

17. The method of claim 16 further comprising:
    forming a first metallization layer over the substrate; and
    forming a second metallization layer over the first metallization layer, one of the first metallization layer or the second metallization layer comprising a bit line trace traversing the first SRAM cell area and the second SRAM cell area, the other of the first metallization layer or the second metallization layer comprising a first word line trace extending across the first SRAM cell area at a direction that intersects the bit line trace and a second word line trace extending across the second SRAM cell area at a direction that intersects the bit line trace.

18. The method of claim 17, wherein the one of the first metallization layer or the second metallization layer further comprises a power trace traversing the first SRAM cell area and the second SRAM cell area, and the other of the first metallization layer or the second metallization layer further comprises a first ground trace extending across the first SRAM cell area at a direction that intersects the bit line trace and a second ground trace extending across the second SRAM cell area at a direction that intersects the bit line trace.

19. The method of claim 17, wherein the one of the first metallization layer or the second metallization layer further comprises a power trace traversing the first SRAM cell area and the second SRAM cell area, and further comprises a ground trace traversing the first SRAM cell area and the second SRAM cell area.

20. The method of claim 17, wherein the one of the first metallization layer or the second metallization layer further comprises (i) a power trace traversing the first SRAM cell area and the second SRAM cell area, (ii) a first ground trace traversing the first SRAM cell area and the second SRAM cell area, and (iii) a second ground trace traversing the first SRAM cell area and the second SRAM cell area, and the other of the first metallization layer or the second metallization layer further comprises a ground mesh trace, a first via electrically coupling the ground mesh trace to the first ground trace, and a second via electrically coupling the ground mesh trace to the second ground trace.

* * * * *